(12) United States Patent
Leung et al.

(10) Patent No.: US 11,784,288 B2
(45) Date of Patent: Oct. 10, 2023

(54) LIGHT-EMITTING DIODES WITH INTEGRATED OPTICAL ELEMENTS

(71) Applicant: Google LLC, Mountain View, CA (US)

(72) Inventors: Benjamin Leung, Sunnyvale, CA (US); Miao-Chan Tsai, Sunnyvale, CA (US); Sheila Hurtt, Palo Alto, CA (US); Gang He, Fremont, CA (US); Richard Peter Schneider, Jr., Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 639 days.

(21) Appl. No.: 16/661,361

(22) Filed: Oct. 23, 2019

(65) Prior Publication Data

US 2020/0135977 A1    Apr. 30, 2020

Related U.S. Application Data

(60) Provisional application No. 62/751,375, filed on Oct. 26, 2018.

(51) Int. Cl.
*H01L 33/32* (2010.01)
*G02B 3/04* (2006.01)
(Continued)

(52) U.S. Cl.
CPC .............. *H01L 33/325* (2013.01); *G02B 3/04* (2013.01); *G02B 27/30* (2013.01);
(Continued)

(58) Field of Classification Search
None
See application file for complete search history.

(56) References Cited

U.S. PATENT DOCUMENTS

2006/0006554 A1\* 1/2006 Yoo ................... H01L 33/20
257/E33.068
2008/0283855 A1 11/2008 Streubel et al.
(Continued)

FOREIGN PATENT DOCUMENTS

CN    107783304 A    3/2018
TW    201727948 A    8/2017

OTHER PUBLICATIONS

International Search Report and Written Opinion corresponding to International Application No. PCT/US2019/057794, dated Jan. 24, 2020.

(Continued)

*Primary Examiner* — Daniel Whalen
(74) *Attorney, Agent, or Firm* — Brake Hughes Bellermann LLP

(57) ABSTRACT

The disclosure describes various aspects of using optical elements monolithically integrated with light-emitting diode (LED) structures. In an aspect, a light emitting device includes a single LED structure having an active region and a single optical element disposed on the LED structure and configured to collimate and steer light emitted by the LED structure. One or more additional optical elements may also be disposed on the LED structure. In another aspect, a light emitting device may include multiple LED structures and a single optical element disposed on the multiple LED structures and configured to collimate and steer light emitted by the multiple LED structures. For each of these aspects, the LED structure(s) and the optical element(s) are made of a material that includes GaN, the LED structure(s) has a corresponding active region, and the LED structure(s) has a corresponding reflective contact disposed opposite to the optical element(s).

65 Claims, 28 Drawing Sheets

(51) Int. Cl.
*G02B 27/30* (2006.01)
*H01L 33/00* (2010.01)
*H01L 33/18* (2010.01)
*H01L 33/60* (2010.01)

(52) U.S. Cl.
CPC .......... *H01L 33/0008* (2013.01); *H01L 33/18* (2013.01); *H01L 33/60* (2013.01)

(56) References Cited

U.S. PATENT DOCUMENTS

| | | |
|---|---|---|
| 2011/0037084 A1 | 2/2011 | Sekii et al. |
| 2013/0256724 A1* | 10/2013 | Jin .......................... H01L 33/20 257/98 |
| 2014/0209930 A1* | 7/2014 | Weng .................. H01L 25/0753 438/26 |
| 2014/0367717 A1* | 12/2014 | Freund .................... H01L 33/24 257/98 |
| 2016/0181476 A1* | 6/2016 | Chang ..................... H01L 33/06 257/13 |
| 2017/0294417 A1 | 10/2017 | Edmond et al. |
| 2018/0196272 A1 | 7/2018 | Chen |

OTHER PUBLICATIONS

Wu, Mount-Lean, et al., "Azimuthally isotropic irradiance of GaN-based light-emitting diodes with GaN microlens arrays", National Central University, Optics Express, vol. 17, Issue 8, pp. 6148-6155 (2009).

Taek, Kim, et al., "A Fabrication of GaN Micro-lens", IEEE Xlpore, Aug. 6, 2002, pp. 54-55.

Kim, Dongwoo, et al., "Effect of GaN Microlens Array on Efficiency of GaN-Based Blue-Light-Emitting Diodes", Japanese Journal of Applied Physics, vol. 44, No. 1, (2005), pp. 18-20.

Choi, H.W., et al., "GaN micro-light-emitting diode arrays with monolithically integrated sapphire microlenses", Applied Physics Letter, vol. 84, No. 13, (2004), pp. 2253-2255.

Office Action for Taiwanese Application No. 108138526 (with English Translation), dated Jul. 7, 2023, 24 pages.

* cited by examiner

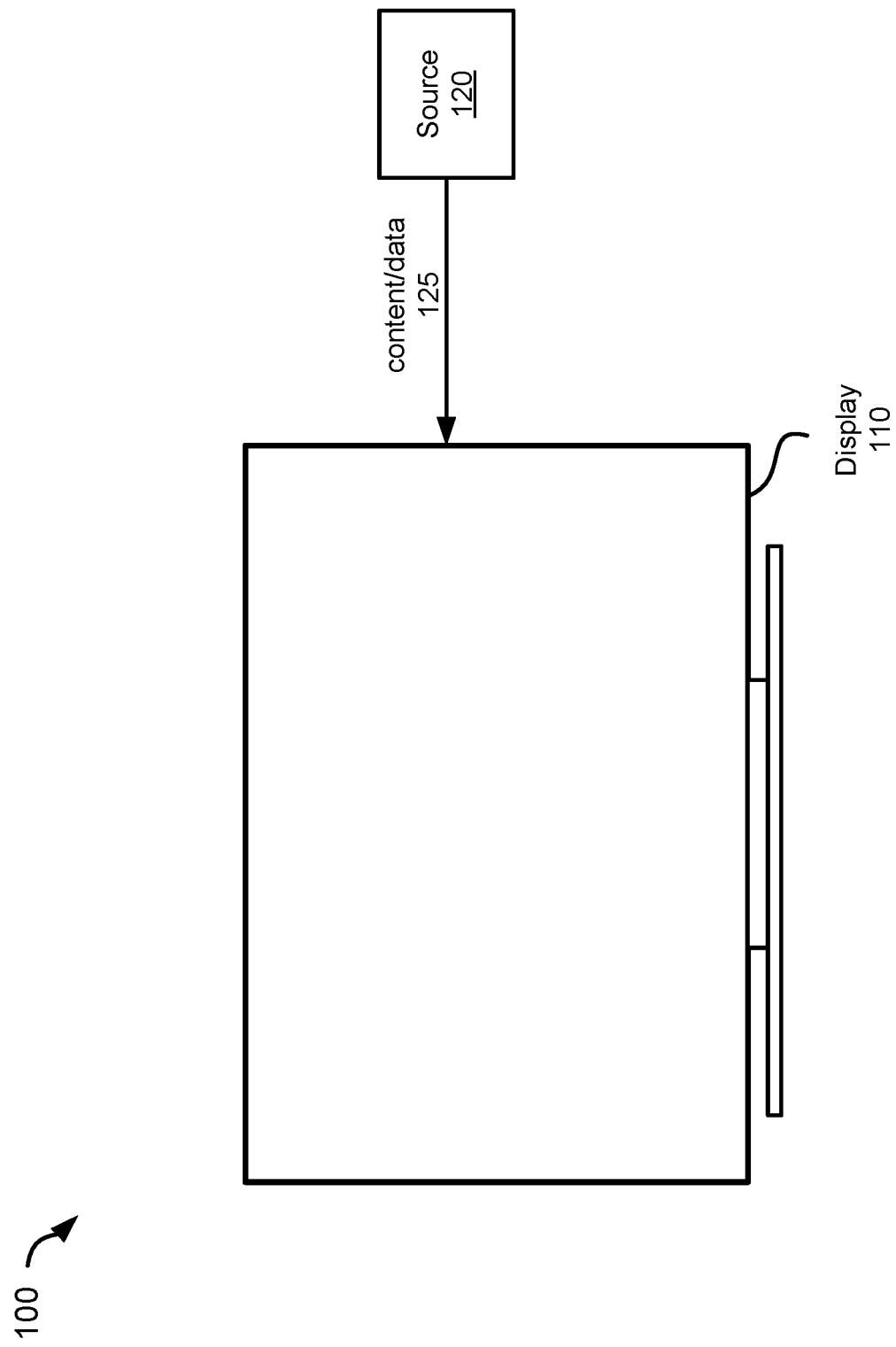

LIGHT-EMITTING DIODES WITH INTEGRATED OPTICAL ELEMENTS

CROSS REFERENCE TO RELATED APPLICATIONS

The present application claims priority to and the benefit of U.S. Provisional Application No. 62/751,375, entitled "LIGHT-EMITTING DIODES WITH INTEGRATED OPTICAL ELEMENTS," and filed on Oct. 26, 2018, the contents of which are incorporated herein by reference in their entirety.

BACKGROUND OF THE DISCLOSURE

Aspects of the present disclosure generally relate to light emitting devices, and more specifically, to light emitting devices with integrated optical elements.

The emission of a typical light-emitting diode (LED) is Lambertian, that is, it has an emitted power that is dependent on the cosine of the emission angle. One effect is that the surface of the LED has the same radiance when viewed from any angle. In many applications, notably in display applications, the light generated is intended to be viewed within a particular range of directions and not from any angle. Therefore, for a typical LED emission pattern a large portion of light output is generated outside the desired viewing directions. That is, there is a large portion of light output that is wasted because it is emitted where it is not intended to be used.

The problem of shaping the light produced by an LED, that is, improving the far-field emission distribution, is one that can be addressed in lighting applications by using luminaire reflectors and various types of lens assemblies. The system level approaches that are suitable for lighting applications, however, may not be compatible with display applications where micro-LEDs (also referred to as microLEDs, mLEDs, or μLEDs) would be typically used. In contrast to lighting applications, for display applications a chip level light shaping solution may be needed instead.

One approach is to use heterogeneous integration of light or beam shaping optics by aligning polymer or glass lenslets to the semiconductor devices (e.g., to an LED or LED structure). The alignment that is necessary for micro-LEDs, however, becomes more challenging because of the size or scale of the devices and heterogeneous integration may be a difficult solution to implement. Moreover, the material from which most commercial lens arrays are made have an index of refraction that is smaller than 2 (i.e., n<2), which is less than the index of refraction of the semiconductor material from which the LED is made, resulting in a less than desirable optical interface between the LED and the respective lenslet. For example, GaN is a semiconductor material that is typically used for making some micro-LEDs and similar optoelectronic devices, and has an index of refraction of approximately 2.4 (i.e., n~2.4), which is greater than that of most commercial lens or lenslet arrays.

Accordingly, techniques, structures, and/or devices are desirable that improve the emission pattern of an LED, particularly for display applications, by better integrating the light or beam shaping optics with a semiconductor structure in the LED that generates and emits the light.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

In an aspect of the disclosure, a light emitting element or device is described that includes an LED structure having an active region and made of a material including GaN, where the active region has a p-side and an n-side. The light emitting device also includes an optical element disposed on the LED structure and made at least in part of a material including GaN, where the optical element is configured to collimate and steer a light emitted by the LED structure. The light emitting device further includes a reflective contact disposed opposite to the optical element.

In another aspect, the optical element of the light emitting device is a first optical element and the light emitting device further includes one or more additional optical elements disposed on the LED structure and made at least in part of a material including GaN, where the one or more additional optical elements are also configured to collimate and steer the light emitted by the LED structure.

In another aspect of the disclosure, a light emitting element or device is described that includes multiple LED structures each having an active region and made of a material including GaN. The light emitting device includes an optical element disposed on the multiple LED structures and made at least in part of a material including GaN, where the optical element is configured to collimate and steer a light emitted by the multiple LED structures. The light emitting device further includes, for each of the multiple LED structures, a reflective contact disposed opposite to the optical element. The multiple LED structures include LED structures configured to produce one or more colors of light.

BRIEF DESCRIPTION OF THE DRAWINGS

The appended drawings illustrate only some implementation and are therefore not to be considered limiting of scope. It is to be understood that some of the sizes, placements, and/or spacing of some of the elements described in the drawings may be exaggerated for purposes of illustration and easier understanding of implementations and configurations.

FIG. 1 illustrates an example of a display and a source of content for the display, in accordance with aspects of this disclosure.

DETAILED DESCRIPTION

Figure 2A:
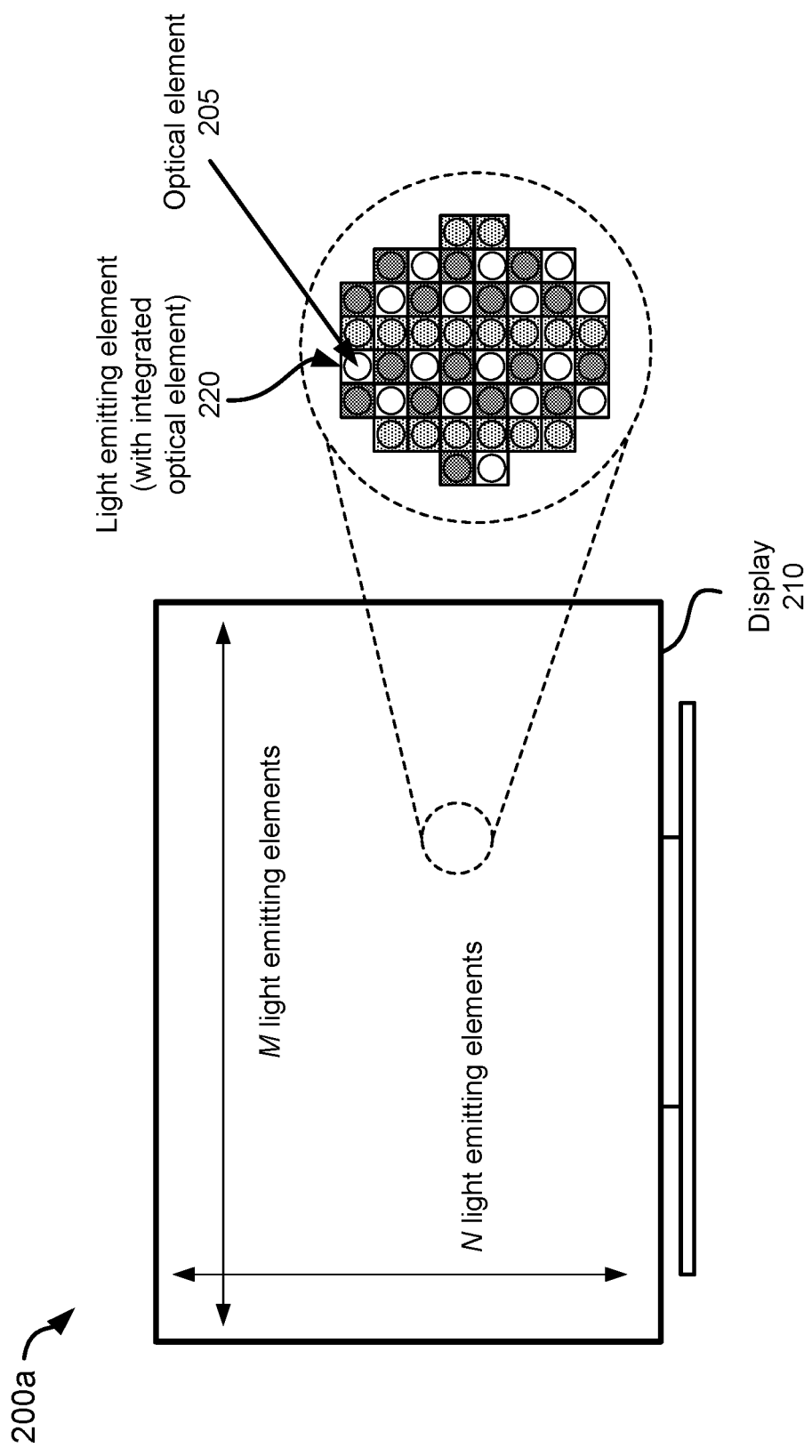
FIGS. 2A-2C illustrate different examples of displays having light emitting elements or devices with integrated optical elements, in accordance with aspects of this disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

LEDs and similar light emitting structures produce useful light generated from a semiconductor junction (or from multiple junctions). One of the inefficiencies of LEDs is associated with significant losses of light before the light that is generated reaches an intended target. These losses result from the inability to effectively extract the light generated from within the semiconductor material. This is a problem that arises in particular in light emitting devices made from compound semiconductor materials because of the high index of refraction of these materials (e.g., GaN having n~2.4) giving the small escape cones (e.g., only within ~25° from normal, the rest experiencing total internal reflection trapping light in the device and reabsorption at interfaces) and reflections at the semiconductor/air interface. For an un-encapsulated GaN LED, for example, a total extraction efficiency is expected to be approximately 4%-5%. Packaging of the semiconductor device with a suitable encapsulant and the use of a luminaire (e.g., including reflectors and domes) can improve the light extracted somewhat, but some degree of chip level light extraction improvement may be needed for commercial LEDs to achieve competitive efficiencies.

A few approaches to improve chip level light extraction include, but need not be limited to, patterned sapphire substrates, random roughening of the surface, photonic crystals, graded refractive index layers, chip shaping (e.g., truncated inverted pyramid). These chip level light extraction techniques while useful for LED applications where the device size ranges from ~100 μm to several millimeters (mm) in dimension, may also be applicable for smaller sizes. For example, patterned sapphire substrates (PSS) typically have pattern size on the order of a few microns. Nano PSS patterning can be used, however, its implementation can be challenging because of additional complexity of needed nanoscale lithographic techniques and etch processes of sapphire. Random roughening through the use of wet or photoelectrochemical etch in many implementations produces features on the order of several microns, and may be implemented in process flows for micro-LEDs but with some challenges due to limited size and larger sidewall exposure. In many applications in which micro-LEDs are used, such as display applications, the device configuration is limited such that the use of additional graded refractive index layers, photonic crystals or chip shaping may again pose some challenges.

Shaping a semiconductor material into a rounded surface to eliminate or reduce the limitations from the escape cone and total internal reflection may be a suitable solution that may be implemented using semiconductor lithographic and etch processes before or after the formation of the rounded surface. Thus by shaping a smooth, curved surface on a semiconductor material, an optical element can be formed that is monolithically integrated to a light emitting structure to improve the optical properties of the light emission, namely the light extraction and emission pattern. When the semiconductor material from which the optical element is made and the semiconductor material from which the light emitting structure is made are the same or similar the integration may be referred to as a "homogeneous" integration. In contrast, when the materials are different, the integration may be referred to as an "heterogeneous" integration.

Various techniques, structures, and/or devices are described in more detail below in connection with FIGS. 1-14 that improve the emission pattern of an LED or similar light emitting device, particularly for display applications, by better integrating the light or beam shaping optical elements with the light emitting semiconductor structure that generates and emits the light.

FIG. 1 shows a diagram 100 that illustrates an example of a display 110 that receives content/data 125 (e.g., image content, video content, or both) from a source 120, where the content/data 125 is processed and displayed by the display 110. The display 110 may include one or more panels (not shown), where each panel in the display 110 can be a light emitting panel or a reflective panel. When light emitting panels are used they can include multiple light emitting elements (see e.g., light emitting elements 220 in FIG. 2A). These light emitting elements can be light-emitting diodes (LEDs) made from one or more semiconductor materials. The LEDs can be an inorganic LEDs. The LEDs can be, for example, micro-LEDs, also referred to as microLEDs, mLEDs, or µLEDs.

The display 110 can have capabilities that include ultra-high-resolution capabilities (e.g., support for resolutions of 8K and higher), high dynamic range (contrast) capabilities, lightfield capabilities, or high directionality. When the display 110 has lightfield capabilities and can operate as a lightfield display, the display 110 can include multiple picture elements (e.g., super-raxels), where each picture element has a respective light steering optical element and an array of light emitting elements (e.g., sub-raxels) monolithically integrated on a same semiconductor substrate, and where the light emitting elements in the array are arranged into separate groups (e.g., raxels) to provide multiple views supported by the lightfield display (see e.g., FIGS. 2D-2F). When the display 110 has high directionality, most of the light produced by the display is directed in a forward direction. An example of a display 110 with high directionality is a microdisplay used for projecting images and/or video in an virtual or augmented reality device such as a hands-free wearable device.

FIG. 2A shows a diagram 200a that illustrates an example of a display 210 having light emitting elements or devices 220 with integrated optical elements 205. The terms "light emitting element," "light emitting device," "light emitter," or simply "emitter," may be used interchangeably in this disclosure to refer to semiconductor-based devices having structures (e.g., multi-layer structures) with one or more regions capable of generating and/or emitting light, to the structures themselves, or to the regions themselves. Moreover, the term "optical element" may refer to a single optical structure (e.g., single lens) or to a compound optical structure (e.g., multiple optical lenses) and the terms "lenslet" and "microlens" may be used interchangeably in this disclosure to refer to an "optical element" having a single optical structure.

The display 210 can be an example or implementation of the display 110 in FIG. 1. In the example described in the diagram 200a, an optical element 205 is integrated (e.g., monolithically integrated) into each corresponding light emitting element 220 to provide a curved shaped surface that aligns with a light emitting region (e.g., an active region) of the light emitting element 220 to improve the optical properties of the light emitting element 220. That is, in this example, there is one optical element 205 for each light emitting element 220 (e.g., for each LED or LED structure). As mentioned above, the optical element 205 can be monolithically integrated to the light emitting element 220, meaning that the optical element 205 can be fabricated, constructed, and/or formed from one or more layers of the same or different materials disposed, formed, and/or grown on the same semiconductor material on which the light emitting structure of the light emitting element is formed. Additional structural and/or device details regarding a one-to-one correspondence between a light emitting element (e.g., the light emitting element 220) having an LED structure (not shown) to generate light and an integrated optical element (e.g., the integrated optical element 205) are provided below in connection with FIGS. 3A-7B, for example.

The display 210 can be used for different types of applications and its size may vary accordingly. For example, the display 210 can have different sizes when used as a display for watches, near-eye applications, phones, tablets, laptops, monitors, televisions, and billboards, to name a few. Accordingly, and depending on the application, the light emitting elements 220 in the display 210 can be organized into arrays, grids, or other types of ordered arrangements of different sizes. The light emitting elements 220 of the display 210 can be distributed over one or more panels.

In the example shown in FIG. 2A, the light emitting elements 220 can be organized or positioned into an N×M array or grid, with N being the number of rows of light emitting elements 220 in the array and M being the number of columns of light emitting elements 220 in the array. The array can be a square or rectangular array, or it can be a hexagonal array or some other organization that provides for a high density arrangement of the light emitting elements 220.

An enlarged portion of such an array is shown to the right of the display 210 where the light emitting elements 220 can include different LEDs on a same semiconductor substrate that produce one or more colors of light, such as red (R) light, green (G) light, blue (B) light, and/or white (W) light, for example. The color pattern shown in the diagram 200a is provide by way of illustration and other color patterns (e.g., Bayer patterns) may also be used. The arrays used may support 4K, 8K, or larger displays 210 based on a same or similar architecture.

Figure 2B:
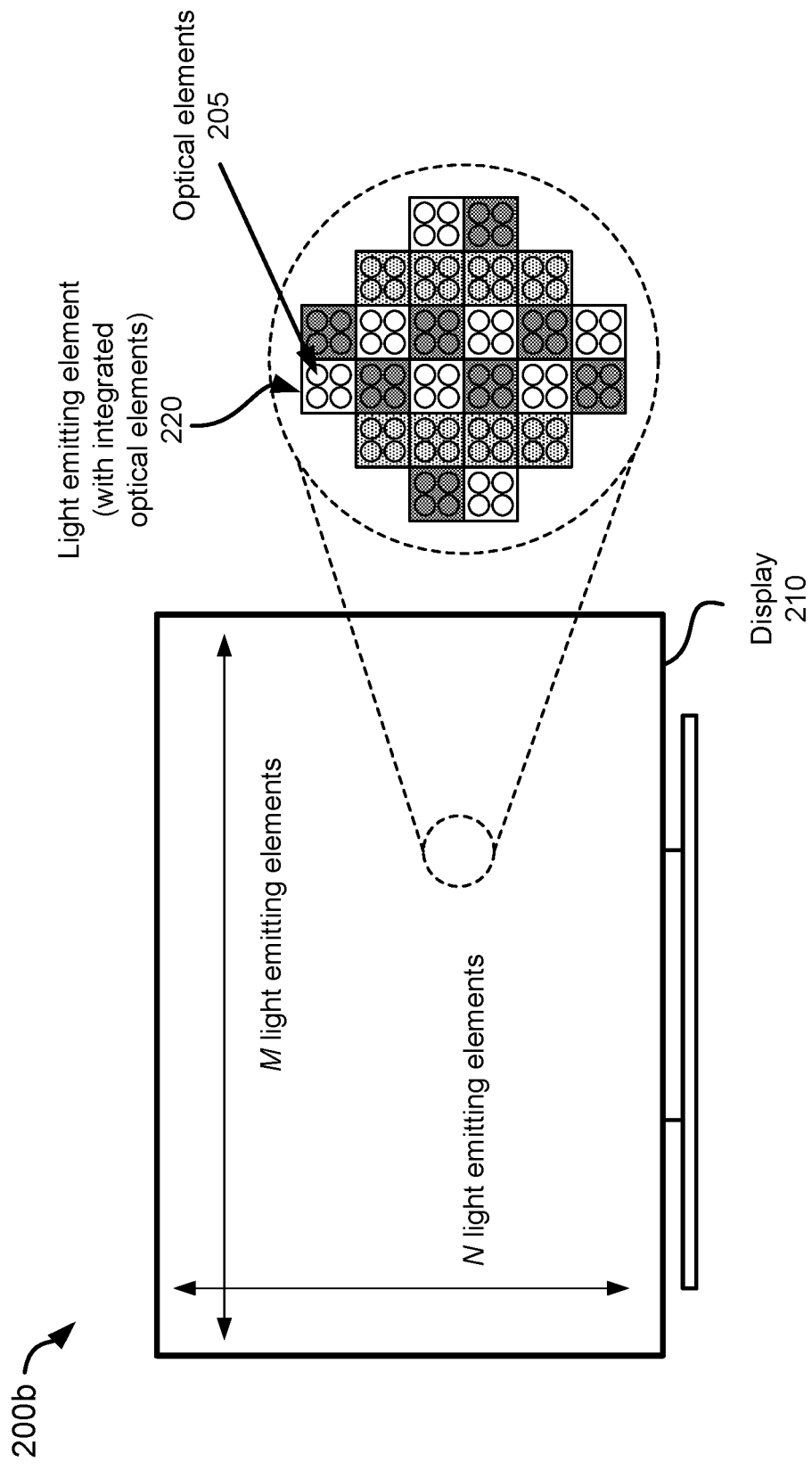

FIG. 2B shows a diagram 200b that illustrates another example of a display 210 having light emitting elements or devices 220 with integrated optical elements 205. In the example described in the diagram 200b, multiple optical elements 205 can be integrated (e.g., monolithically integrated) into each light emitting element 220 to provide curved lens surfaces that align with a light emitting region (e.g., an active region) of the light emitting element 220 that improve the optical properties of the light emitting element 220. That is, in this example, there are multiple optical elements 205 for each light emitting element 220 (e.g., for each LED or LED structure). Additional structural and/or device details regarding a one-to-many correspondence between a light emitting element having an LED structure to generate light and multiple homogeneously integrated optical elements are provided below in connection with FIGS. 10B and 11B, for example.

While the example in the diagram 200b shows four (4) optical elements 205 for each light emitting elements 220, the disclosure need not be so limited and more or fewer optical elements 205 may be integrated into a light emitting element 220. Moreover, while the example in the diagram 200b shows the optical elements 205 being confined to within a perimeter of their corresponding light emitting element 220, the disclosure need not be so limited and one or more optical elements 205 may extend beyond the perimeter of the light emitting element 220 and/or overlap with another light emitting element 220.

Figure 2C:
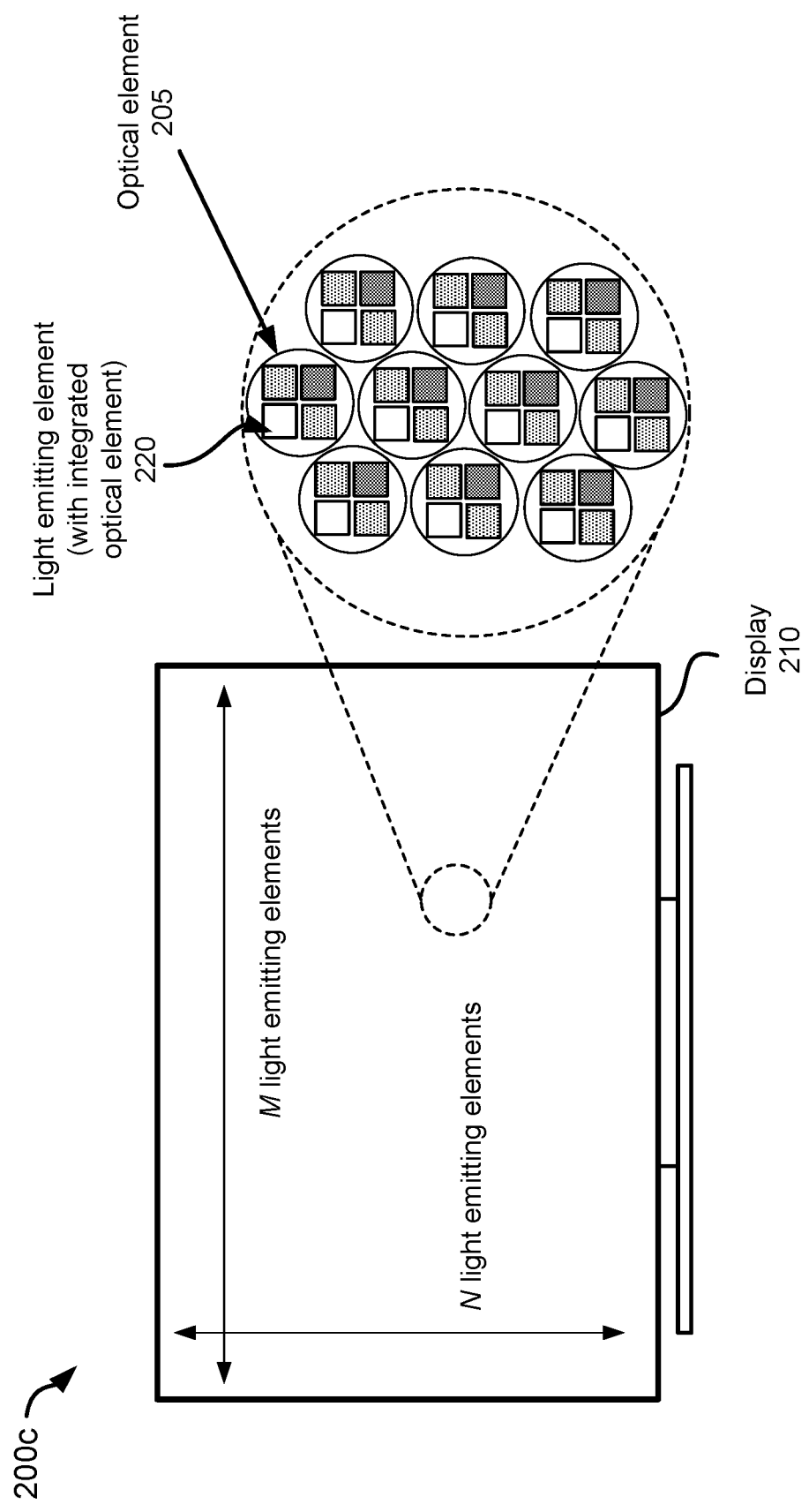

FIG. 2C shows a diagram 200c that illustrates yet another example of a display 210 having light emitting elements or devices 220 with integrated optical elements 205. In the example described in the diagram 200c an optical element 205 can be integrated (e.g., monolithically integrated) with multiple light emitting elements 220 to provide a curved lens surface that aligns with light emitting regions (e.g., active regions) of the light emitting elements 220 to improve the optical properties of the light emitting elements 220. That is, there are multiple light emitting elements 220 (e.g., multiple LEDs or LED structures) for each optical element 205. Additional structural and/or device details regarding a many-to-one correspondence between multiple light emitting elements each having an LED structure to generate light and a homogeneously integrated optical element are provided below in connection with FIGS. 9, 10A, and 11A, for example.

While the example in the diagram 200c shows approximately four (4) light emitting elements 220 for each optical element 205, the disclosure need not be so limited and more or fewer light emitting elements 220 may be integrated with an optical element 205.

Moreover, while the light emitting elements 220 have been shown as square-shaped elements, this is for purposes of illustration and they can have different shaped areas suitable for manufacturing and/or increased packing, including hexagonal-shaped areas, for example. Similarly, while the optical elements 205 have been shown as circle-shaped elements, this is for purposed of illustration and they can have different shaped areas suitable to provide the proper optical effects, including oval-shaped areas, for example.

Figure 2D:
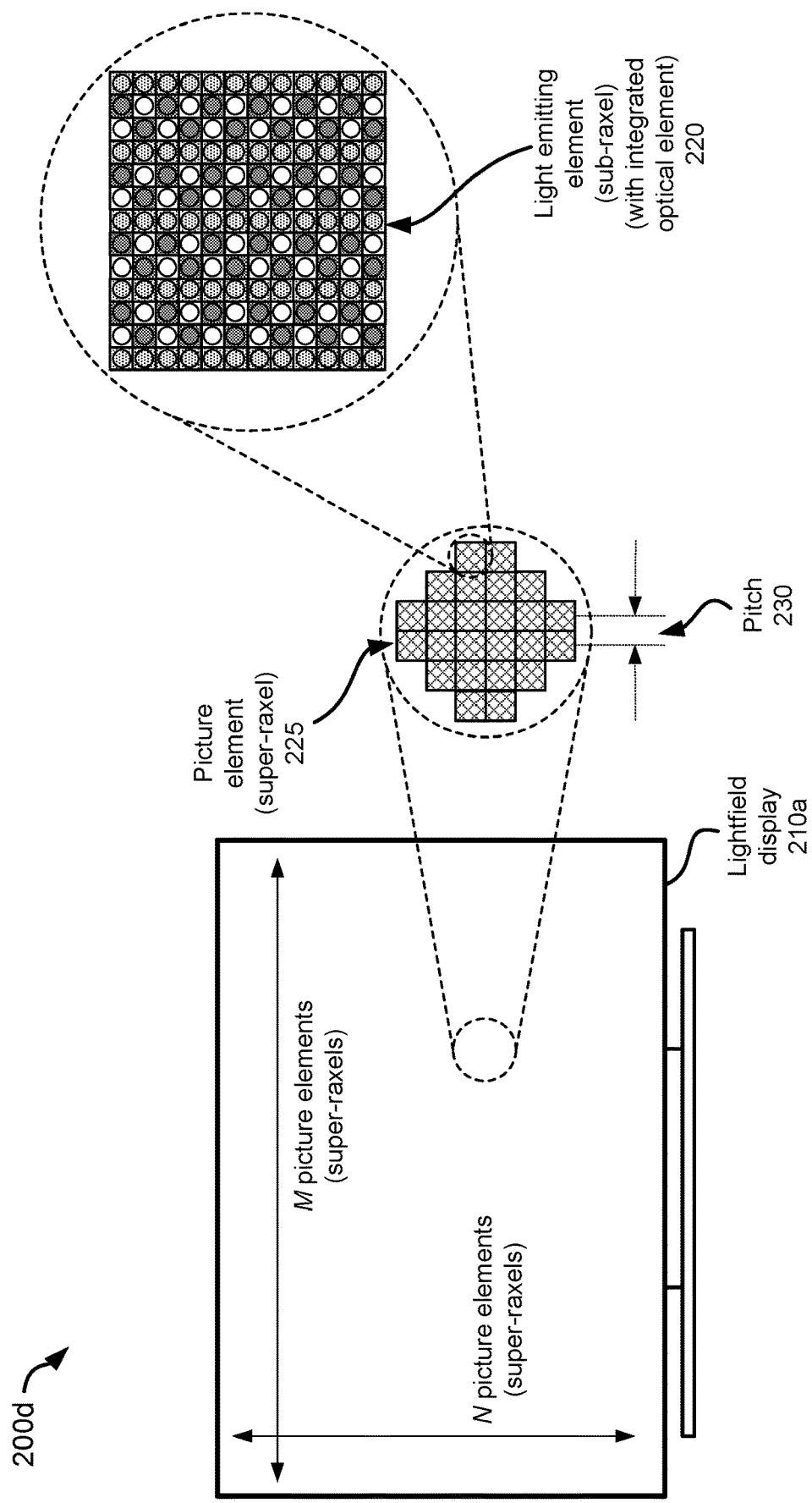
FIGS. 2D and 2E illustrate examples of lightfield displays having multiple picture elements, in accordance with aspects of this disclosure.

A diagram 200d in FIG. 2D shows a lightfield display 210a having multiple picture elements or super-raxels 225. In this disclosure, the term "picture element" and the term "super-raxel" can be used interchangeably to describe a similar structural unit in a lightfield display. The lightfield display 210a may be an example of the display 110 in FIG. 1 having lightfield capabilities. The lightfield display 210a can be used for different types of applications and its size may vary accordingly. For example, a lightfield display 210a can have different sizes when used as a display for watches, near-eye applications, phones, tablets, laptops, monitors, televisions, and billboards, to name a few. Accordingly, and depending on the application, the picture elements 225 in the lightfield display 210a can be organized into arrays, grids, or other types of ordered arrangements of different sizes. The picture elements 225 of the lightfield display 210a can be distributed over one or more panels.

In the example shown in the diagram 200d, the picture elements 225 can be organized or positioned into an N×M array, with N being the number of rows of picture elements 225 in the array and M being the number of columns of picture elements 225 in the array. The array can be a square or rectangular array, or it can be a hexagonal array or some other organization that provides for a high density arrangement of the picture elements 225.

An enlarged portion of such an array is shown to the right of the lightfield display 210a. For small displays, examples of array sizes can include N≥10 and M≥10 and N≥100 and M≥100, with each picture element 225 in the array having itself an array or grid of light emitting elements 220 or sub-raxels (as shown further to the right). For larger displays, examples of array sizes can include N≥500 and M≥500, N≥1,000 and M≥1,000, N≥5,000 and M≥5,000, and N≥10,000 and M≥10,000, with each picture element 220 in the array having itself an array or grid of light emitting elements 220.

As described in the examples in the diagrams 200a, 200b, and 200c the light emitting elements 220 can have integrated optical elements 205, where in one configuration there is one optical element 205 integrated with a corresponding light emitting element 220 (see e.g., the diagram 200a in FIG. 2A), in another configuration there are multiple optical elements 205 integrated with a corresponding light emitting element 220 (see e.g., the diagram 200b in FIG. 2B), and in yet another configuration there are multiple light emitting elements 225 integrated with a single optical element 205 (see e.g., the diagram 200c in FIG. 2C).

In a more specific example, for a 4K lightfield display in which the pixels in a traditional display are replaced by the picture elements 225, the N×M array of picture elements 225 can be a 2,160×3,840 array including approximately 8.3 million picture elements 225. Depending on the number of light emitting elements 220 (with integrated optical elements 205) in each of the picture elements 225, the 4K lightfield display can have a resolution that is one or two orders of magnitude greater than that of a corresponding traditional display. When the picture elements or super-raxels 225 include as light emitting elements 220 multiple LEDs (e.g., multiple micro-LEDs) on a same semiconductor substrate that produce one or more colors of light, such as red (R) light, green (G) light, and blue (B) light, the 4K lightfield display can be said to be made from monolithically integrated RGB LED super-raxels. Although not described in detail, 8K or larger lightfield displays are also possible using a similar architecture.

Each of the picture elements 225 in the lightfield display 210a, including its corresponding light steering optical element 215 (an imaging lens illustrated in a diagram 200e in FIG. 2E), can represent a minimum picture element size limited by display resolution. In this regard, an array or grid of light emitting elements 220 of a picture element 225 can be smaller than the corresponding light steering optical element 215 for that picture element. In practice, however, it is possible for the size of the array or grid of light emitting elements 220 of a picture element 225 to be similar to the size of the corresponding light steering optical element 215 (e.g., the diameter of a microlens), which in turn is similar or the same as a pitch 230 between picture elements 225.

As mentioned above, an enlarged version of an array of light emitting elements 220 for a picture element 225 is shown to the right of the diagram 200d. The array of light emitting elements 220 can be a P×Q array, with P being the number of rows of light emitting elements 220 in the array and Q being the number of columns of light emitting elements 220 in the array. The array can be a square or rectangular array, or it can be a hexagonal array or some other organization that provides for a high density arrangement of the light emitting elements 220. Examples of array sizes can include P≥5 and Q≥5, P≥8 and Q≥8, P≥9 and Q≥9, P≥10 and Q≥10, P≥12 and Q≥12, P≥20 and Q≥20, and P≥25 and Q≥25. In an example, a P×Q array is a 9×9 array including 81 light emitting elements or sub-raxels 220.

For each picture element 225, the light emitting elements 220 in the array can include separate and distinct groups of light emitting elements 220 (see e.g., group of light emitting elements 260 in FIG. 2F) that are allocated or grouped (e.g., logically grouped) based on spatial and angular proximity and that are configured to produce different light outputs (e.g., directional light outputs) that contribute to produce lightfield views provided by the lightfield display 210a to a viewer. The grouping of sub-raxels or light emitting elements 220 into raxels need not be unique. For example, during assembly or manufacturing, there can be a mapping of sub-raxels into particular raxels that best optimize the display experience. A similar re-mapping can be performed by the display once deployed to account for, for example, aging of various parts or elements of the display, including variations in the aging of light emitting elements of different colors and/or in the aging of light steering optical elements. In this disclosure, the term "groups of light emitting elements" and the term "raxel" can be used interchangeably to describe a similar structural unit in a lightfield display. The lightfield views produced by the contribution of the various groups of light emitting elements or raxels can be perceived by a viewer as continuous or non-continuous views.

Each of the groups of light emitting elements 220 in the array of light emitting elements 220 includes light emitting elements that produce one or more colors of light (e.g., red light, green light, blue light, and perhaps also white light). In one example, each of these groups or raxels includes at least one light emitting element 220 that produces red light, one light emitting element 220 that produces green light, and one light emitting element 220 that produces blue light. In another example, each of these groups or raxels includes two light emitting elements 220 that produce red light, one light emitting element 220 that produces green light, and one light emitting element 220 that produces blue light. In yet another example, each of these groups or raxels includes one light emitting element 220 that produces red light, one light emitting element 220 that produces green light, one light emitting element 220 that produces blue light, and one light emitting element 220 that produces white light.

Because of the various applications (e.g., different sized lightfield displays) descried above, the sizes or dimensions of some of the structural units described in connection with the lightfield display 210a can vary significantly. For example, a size of an array or grid of light emitting elements 220 (e.g., a diameter, width, or span of the array or grid) in a picture element 225 can range from about 10 microns to about 1,000 microns. That is, a size associated with a picture element or super-raxel 225 can be in this range. The term "about" as used in this disclosure indicates a nominal value or a variation within 1%, 2%, 3%, 4%, 5%, 10%, 15%, 20%, or 25% from the nominal value.

In another example, a size of each group of light emitting elements 220 (e.g., a diameter, width, or span of the group) in a picture element 225 can range from about 1 micron to about 10 microns. That is, a size associated with a group of light emitting elements 220 (e.g., raxel 260) can be in this range.

In yet another example, a size of each light emitting element 220 (e.g., a diameter, width, or span of the light emitting element or sub-raxel) can range from about 0.4 microns to about 4 microns. Similarly, a size of each light emitting element 220 (e.g., a diameter, width, or span of the light emitting element or sub-raxel) can be less than about 1 micron. That is, a size associated with a light emitting element or sub-raxel 220 can be in the ranges described above.

In yet another example, a size of a light steering optical element 215 (e.g., a diameter, width, or span of a microlens or lenslet) can range from about 10 microns to about 1,000 microns, which is similar to the range of sizes for a picture element or super-raxel 225.

Figure 2E:
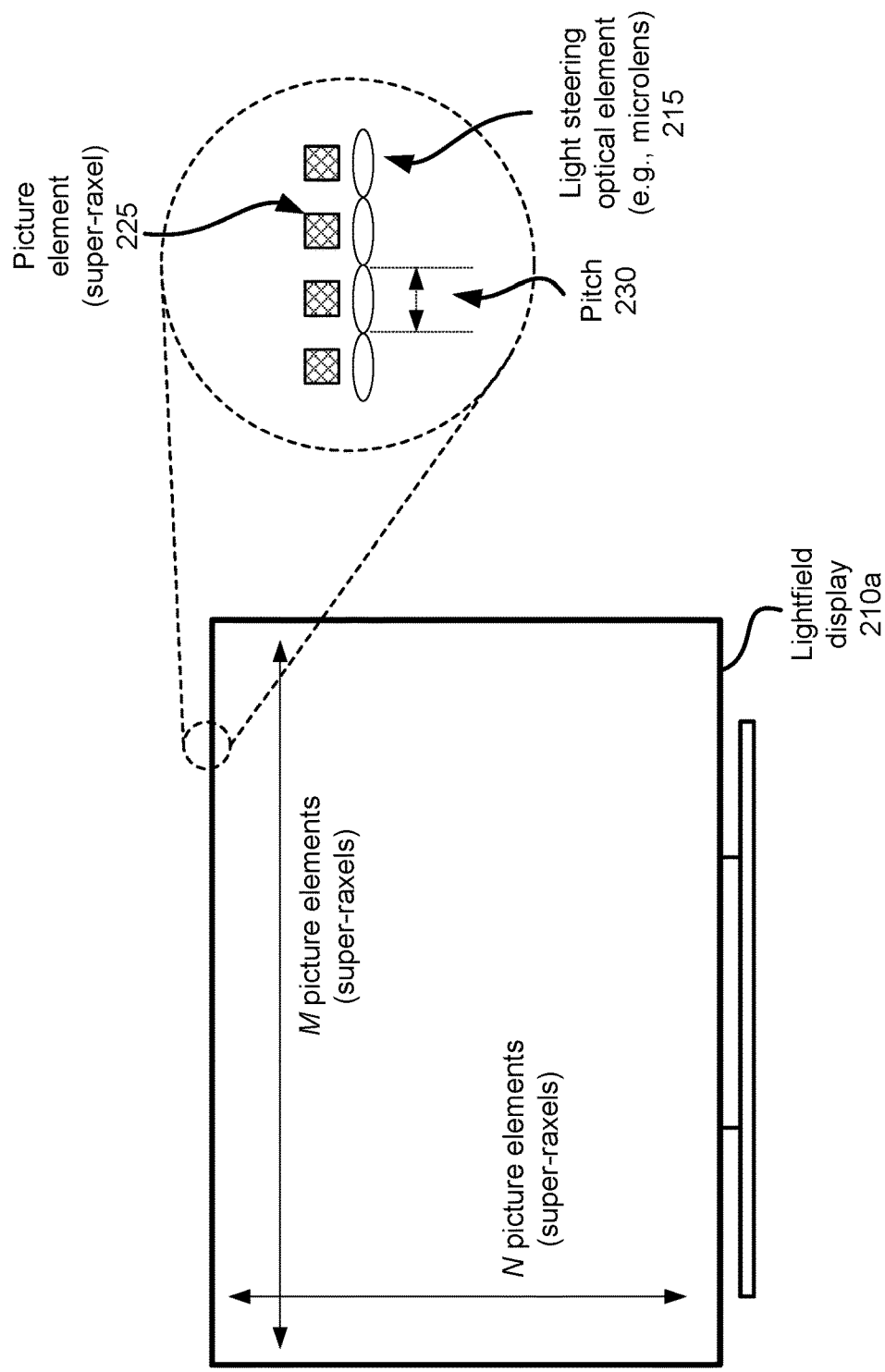

In FIG. 2E, a diagram 200e shows another example of the lightfield display 210a illustrating an enlarged view of a portion of an array of picture elements 225 with corresponding light steering optical elements 215 as described above. The pitch 230 can represent a spacing or distance between picture elements 225 and can be about a size of the light steering optical element 215 (e.g., size of a microlens). In this disclosure, the light steering optical element 215 corresponding to a picture element 225 and the individual optical elements 205 integrated with the light emitting elements 220 of the picture element 225 can be both referred to as a "microlens" or a "lenslet" interchangeably. For example, there may be a lenslet or microlens integrated with a light emitting element 220 (e.g., an LED or LED structure) and there may be another lenslet or microlens (e.g., part of a lenslet or microlens array) that is disposed over the picture element 225 that include the light emitting element 220 with the integrated lenslet or microlens.

In this example, the lightfield display 210a can be a 4K lightfield display with a 2,160×3,840 array of picture elements or super-raxels 225. Each of the picture elements 225 may include multiple light emitting elements 220 with integrated optical elements 205 (not shown). For a viewer distance of about 1.5 meters or about 5 feet, a size of the light steering optical element 115 can be about 0.5 millimeters. Such a size can be consistent with human acuity of about 1 arc-minute/picture element. The viewer's field of view (FOV) in this example can be about 64 degrees, which can be less than a viewing angle provided by the picture element (e.g., viewing angle>FOV). Moreover, the multiple views provided by the 4K lightfield display in this example can have a 4 millimeter spacing, consistent with a diameter of the human pupil. This can translate to the light steering optical element 215 steering the output light produced by a picture element 225 having, for example, $31^2$ light emitting elements 220 (with integrated optical elements 205—not shown). Accordingly, the 4K lightfield display in this example can provide continuous parallax with lightfield phase. A similar result may be provided by lightfield displays of 8K or larger size.

Figure 2F:
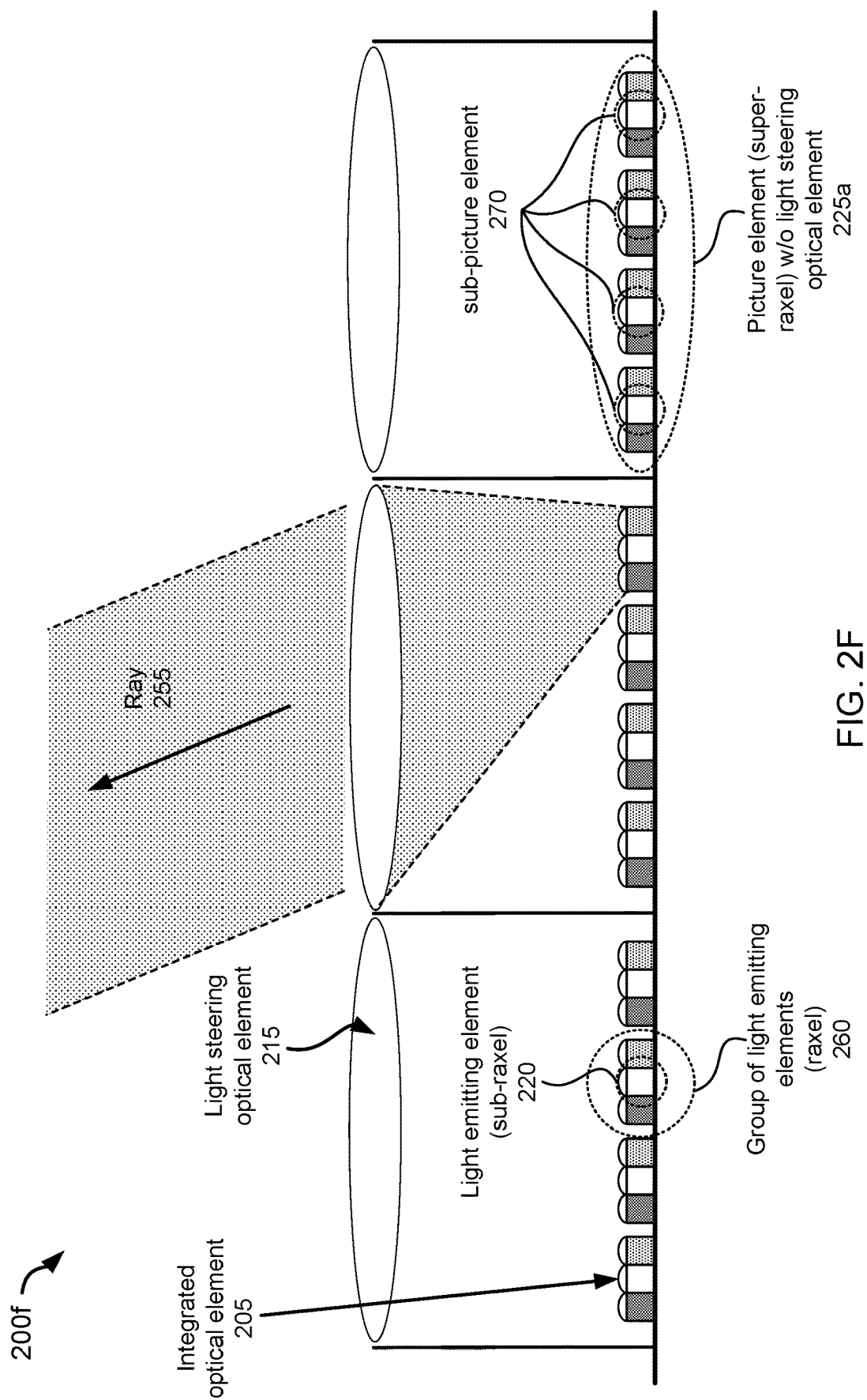
FIG. 2F illustrates an example of a cross-sectional view of a portion of a lightfield display, in accordance with aspects of this disclosure.

A diagram 200f in FIG. 2F shows a cross-sectional view of a portion of a lightfield display (e.g., the lightfield display 210a) to illustrate some of the structural units described in this disclosure for when the display 110 in FIG. 1 is configured as a lightfield display. For example, the diagram 200f shows three adjacent picture elements or super-raxels 225a, each having a corresponding light steering optical element 215. In this example, the light steering optical element 215 can be considered separate from the picture element 225a but in other instances the light steering optical element 215 can be considered to be part of the picture element.

As shown in FIG. 2F, each picture element 225a includes multiple light emitting elements 220 (e.g., multiple sub-raxels), each of which has one or more corresponding integrated optical elements 205. Several light emitting elements 220 (e.g., several sub-raxels) of different types can be grouped together into the group 260 (e.g., into a raxel). A group or raxel can produce various components that contribute to a particular ray element 255 as shown by the right-most group or raxel in the middle picture element 225a. Is it to be understood that the ray elements 255 produced by different groups or raxels in different picture elements can contribute to a view perceived by viewer away from the lightfield display.

An additional structural unit described in FIG. 2F is the concept of a sub-picture element 270, which represents a grouping of the light emitting elements 220 of the same type (e.g., produce the same color of light) of the picture element 225a.

More detailed aspects of the various structures, devices, and configurations described above in connection with having optical elements 205 homogeneously integrated with light emitting elements or devices 220 are provided below in connection with FIGS. 3A-14.

Figure 3A:
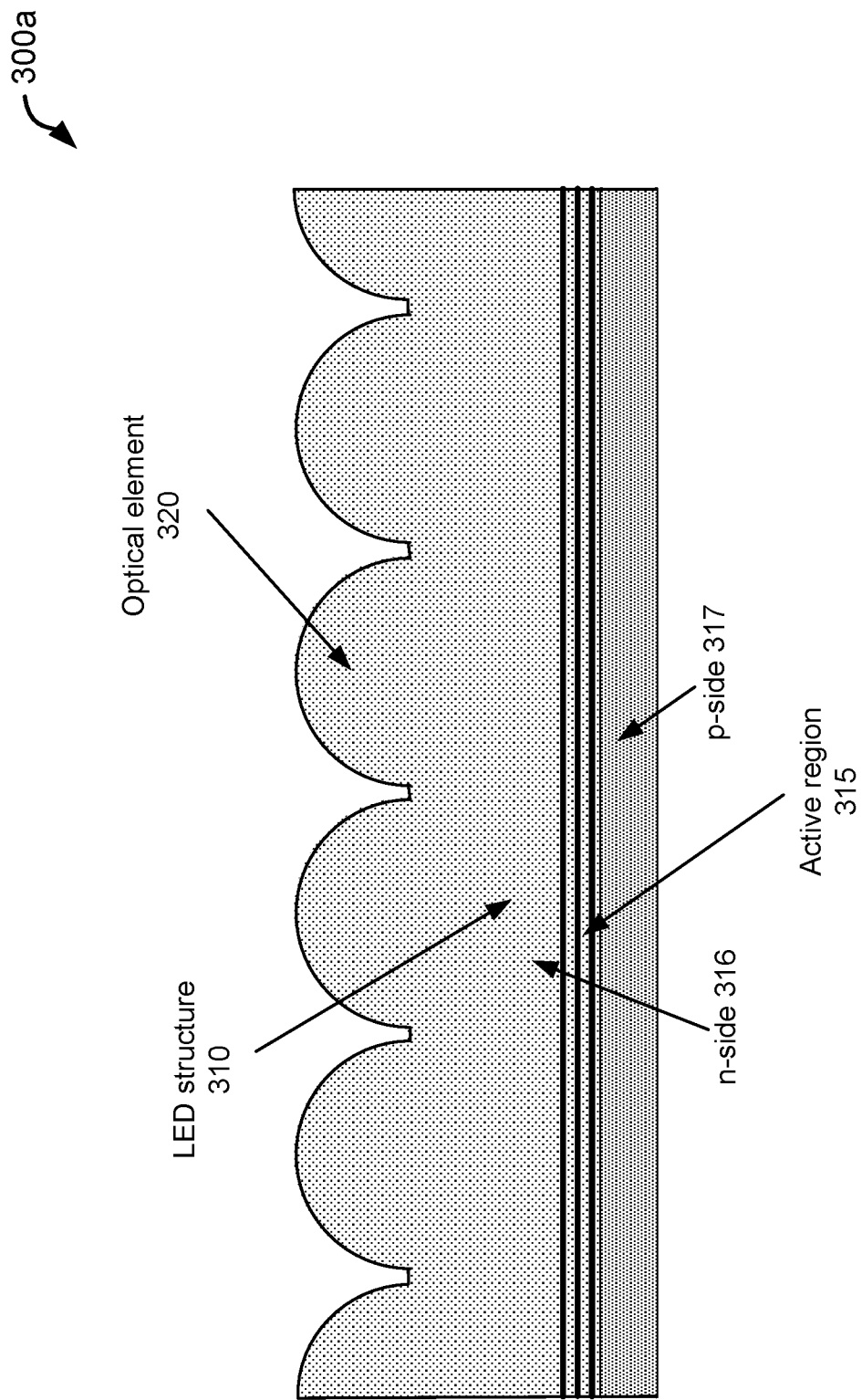
FIGS. 3A-3C illustrate cross-sectional views of different examples of LED structures with integrated optical elements, in accordance with aspects of this disclosure.

A diagram 300a in FIG. 3A shows a cross-sectional view of a structure (e.g., a layered structure) that illustrates a light emitting element or device (e.g., light emitting element 220) having an LED structure (e.g., LED structure 310) onto which there are integrated multiple optical elements (e.g., optical elements 320). The LED structure 310 includes an active region 315 from which light is generated. The active region 315 can include one or more junctions, and can have an n-type semiconductor layer or structure (e.g., n-side 316) on one side (e.g., closest to the optical elements 320) and a p-type semiconductor layer or structure (e.g., p-side 317) opposite to the n-type semiconductor layer. In one example, the active region 315 may be formed on a planarized surface of the semiconductor material from which both the LED structure 310 and the optical elements 320 are made. Moreover, the active region 315 may include one or more quantum wells (multi-quantum well or MQW structure) from which light is generated by the active region 315. For "homogeneous" integration between the optical elements 320 and the LED structure 310, both the optical elements 320 and the LED structure 310 can be made of the same or similar semiconductor material. In one example, both the optical elements 320 and the LED structure 310 can be made of a material that includes GaN (e.g., a GaN-based semiconductor material). For "heterogeneous" integration between the optical elements 320 and the LED structure 310, the optical elements 320 and the LED structure 310 can be made of the different semiconductor materials (e.g., materials made of different compounds and/or different compositions).

While the diagram 300a shows a cross-sectional view that includes a linear array of optical elements 320 formed on and integrated to the LED structure 310, it is to be understood that the optical elements 320 can be formed in a two-dimensional array (e.g., into and/or out of the plane of the diagram 300a), where the array can be a square, a rectangular, or a hexagonal array, and where the perimeter of any one of the optical elements 320 can be in close proximity or adjacent to the perimeter of another one of the optical elements 320.

Figure 3B:
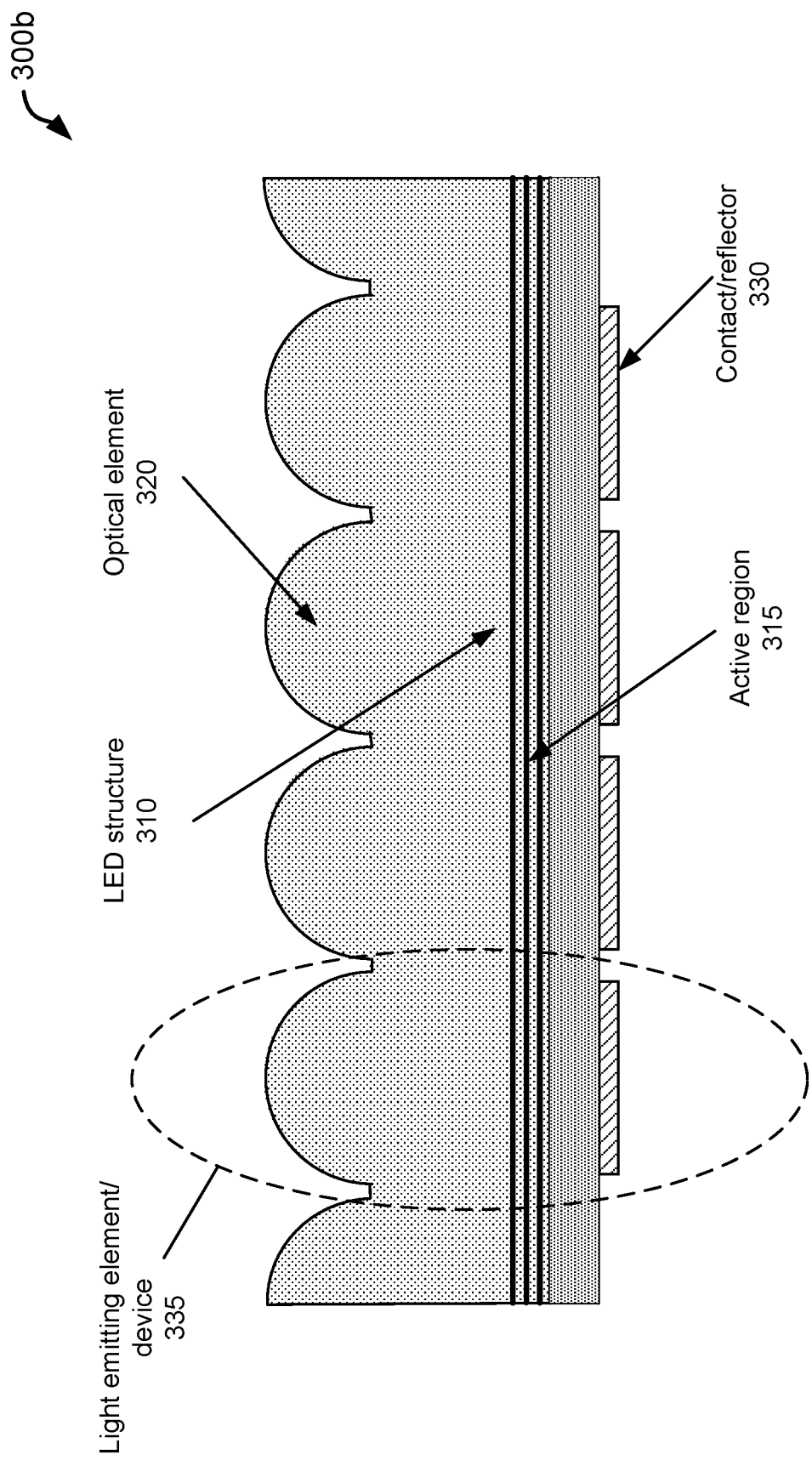

FIG. 3B shows a diagram 300b where the structure in the diagram 300a now includes one or more contacts/reflectors 330 disposed opposite to the optical elements 320. The structure including an optical element 320, the LED structure 310 with the active region 315, and the contact/reflector 330 may correspond in this example to individual light emitting elements or devices 335. The light emitting elements 335 may be examples of the light emitting elements 220 described above in connection with FIGS. 2A-2F, which may also be referred to as an LED or micro-LED, for example. A contact layer 337 may be used to allow for better contact between the active region 315 and the contacts/reflectors 330. The contact/reflector 330 may not only provide electrical contact but may also be used to redirect light generated by the active region 315 towards the corresponding optical element 320.

While a single contact (e.g., contact/reflector 330) is shown for a light emitting device 335, it is to be understood that an additional electrical contact may be made with the light emitting device 335 at another location such as at a location into or out of the plane of the diagram 300b.

Figure 3C:
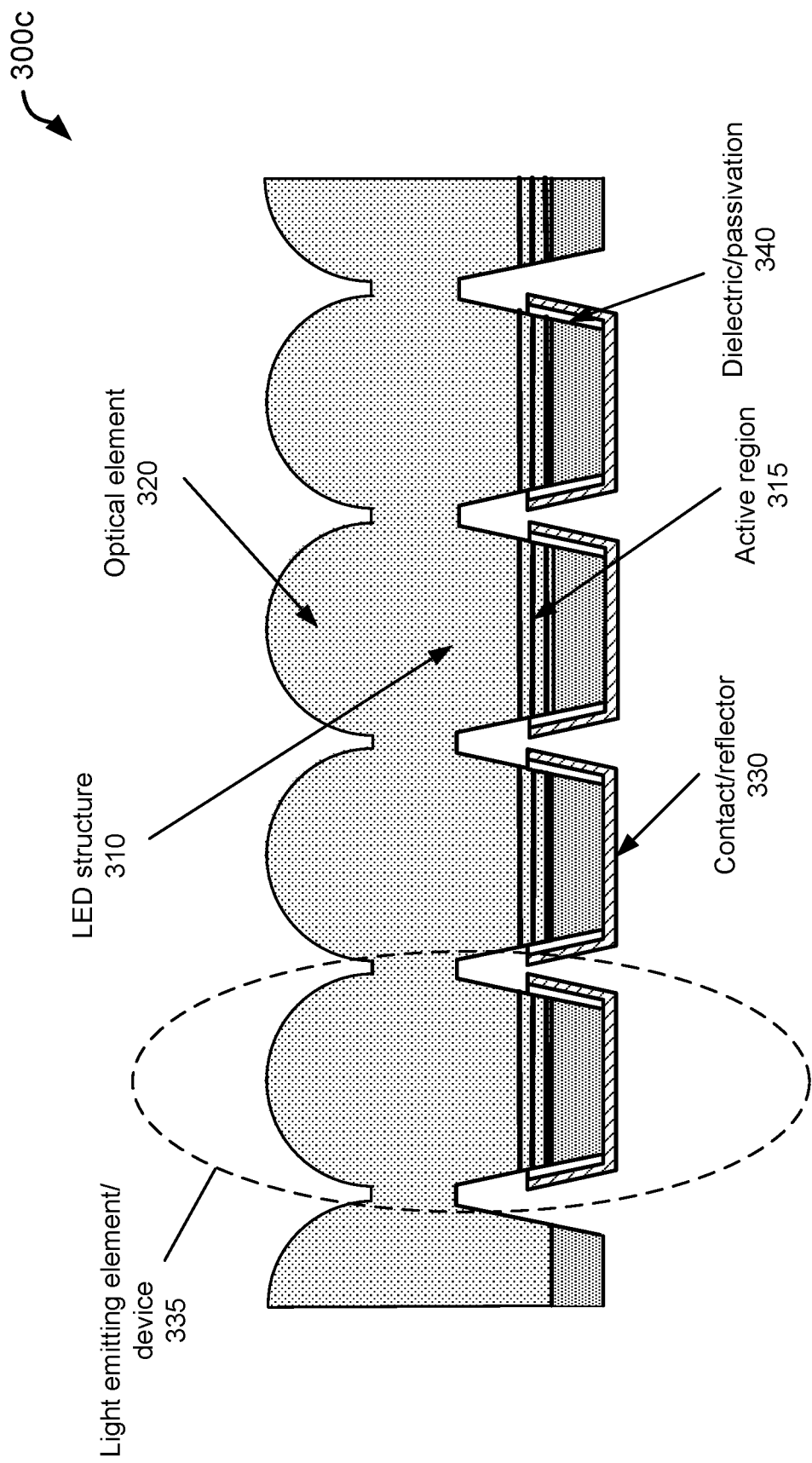

FIG. 3C shows a diagram 300c where the layered structure in the diagram 300a has been etched to isolate portions of the active region 315 that are aligned with corresponding optical elements 320. The etching produces tapered sidewalls around or about the portion of the LED structure 310 that contains the active region 315. On at least part of these tapered sidewalls can be disposed a dielectric/passivation 340, which in turn can be at least partially covered by the contact/reflector 330 that also covers a flat surface opposite the optical element 320. The contact/reflector 330 along with the dielectric/passivation 340 may be used to redirect light generated by the active region 315 towards the corresponding optical element 320. As shown in the diagram 300c the structure including the optical element 320, the LED structure 310 with the active region 315 and tapered sidewalls, the contact/reflector 330, and the dielectric/passivation 340 may correspond in this example to individual light emitting elements or devices 335.

Figure 4A:
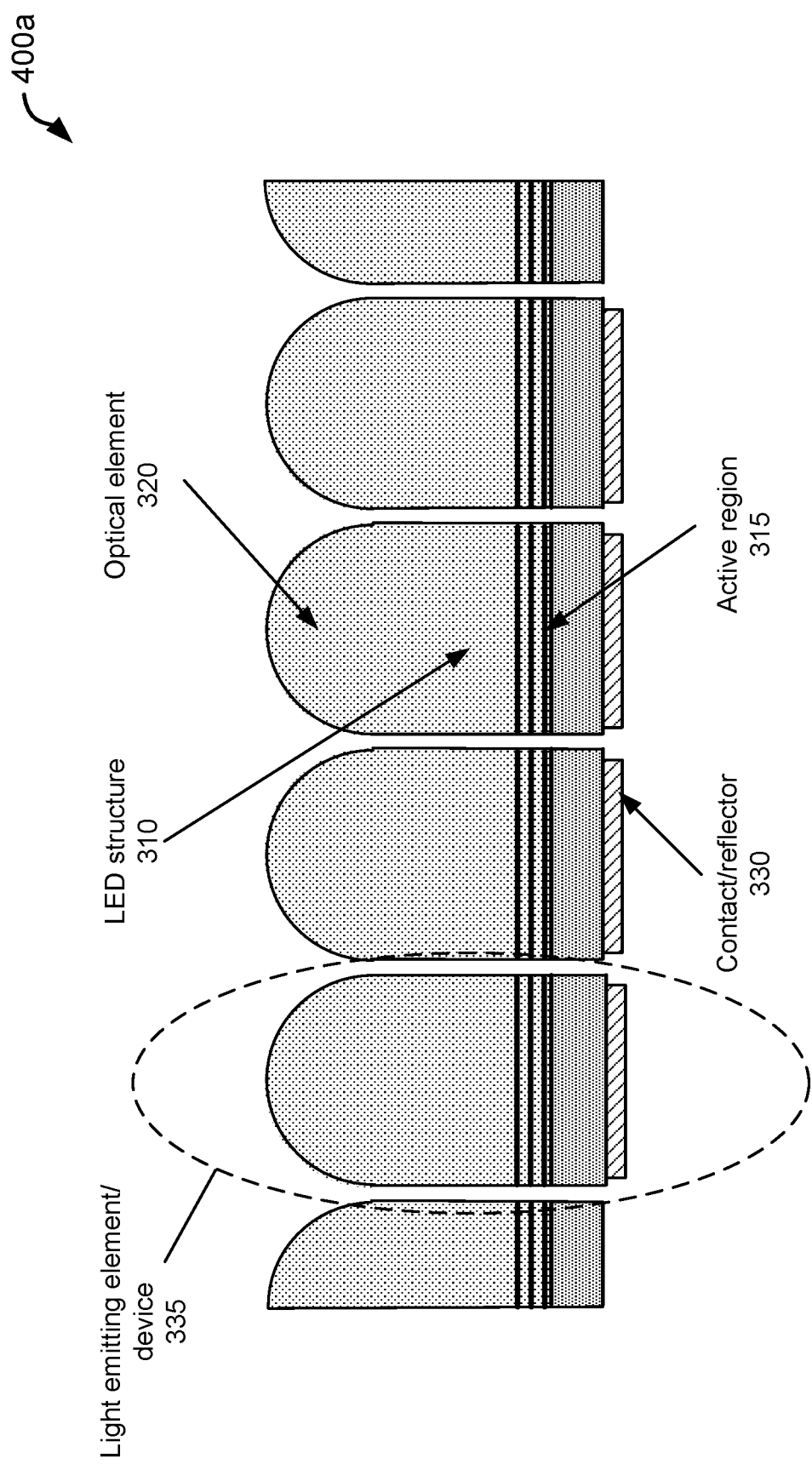
FIGS. 4A-4E illustrate cross-sectional views of different examples of separated or isolated LED structures with integrated optical elements, in accordance with aspects of this disclosure.

FIG. 4A shows a diagram 400a in which the structure described above in connection with the diagram 300b in FIG. 3B has been further processed (e.g., deep trench etch) to completely separate or isolate the various light emitting elements or devices 335 from each other. Each of these separated or isolated light emitting elements 335 include an optical element 320 integrated (e.g., monolithically integrated) with an LED structure 310 having an active region 315, and a contact/reflector 330 positioned or disposed on a flat surface opposite the optical element 320. As indicated above, the separated or isolated light emitting elements or devices 335 can be arranged in a two-dimensional array and the diagram 400a merely shows a cross-sectional view of part of such an array.

Figure 4B:
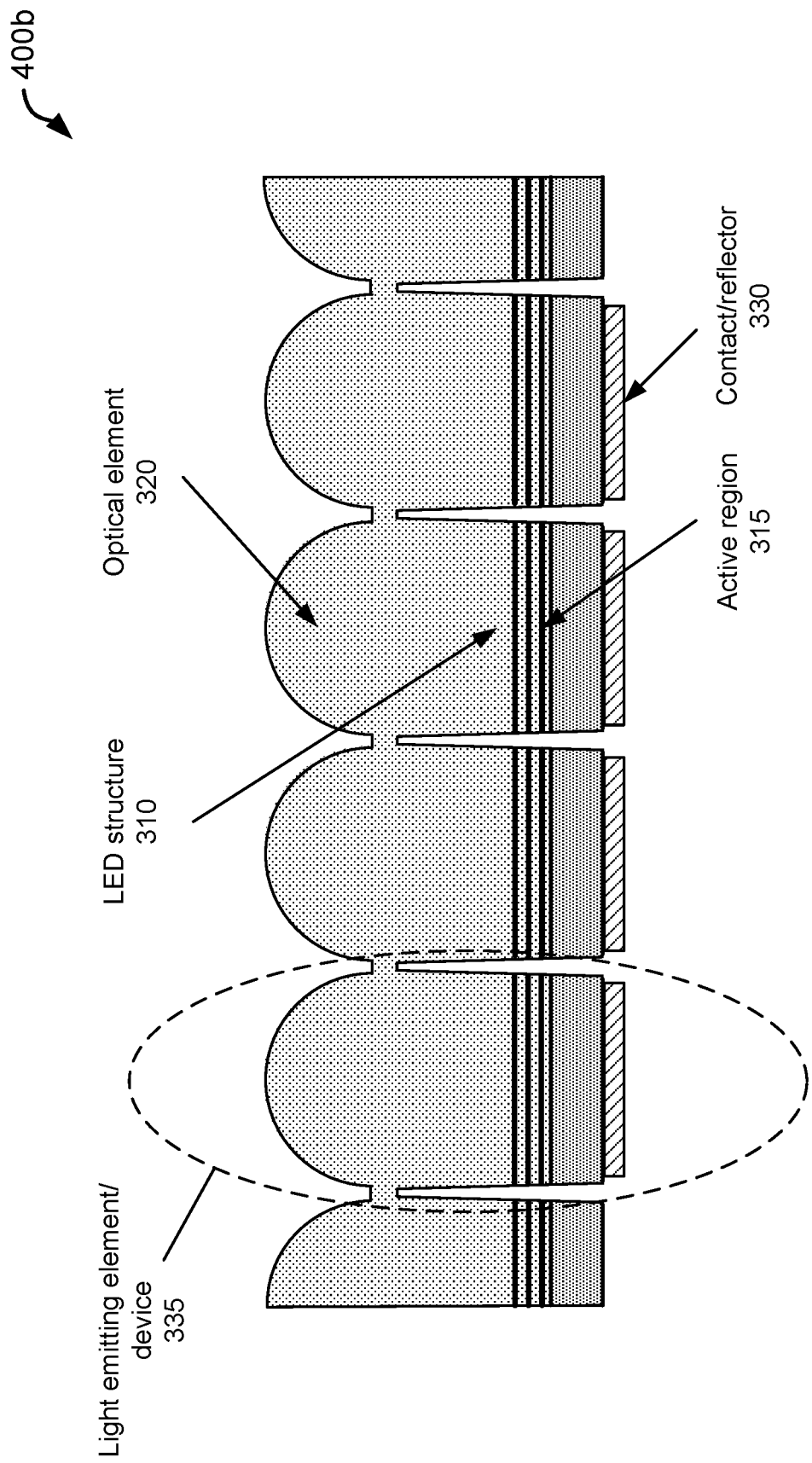

FIG. 4B shows a diagram 400b in which the structure described above in connection with the diagram 300b in FIG. 3B has been further processed (e.g., deep trench etch) to mostly (but not entirely) separate or isolate the various light emitting elements or devices 335 from each other. Each of these partially separated or isolated light emitting elements 335 include an optical element 320 integrated (e.g., monolithically integrated) with an LED structure 310 having an active region 315, and a contact/reflector 330 positioned or disposed on a flat surface opposite the optical element 320. In this examples, the sidewalls produced by the further processing that is performed may be slightly tapered or may be straight, depending on the type of processing that is performed.

Figure 4C:
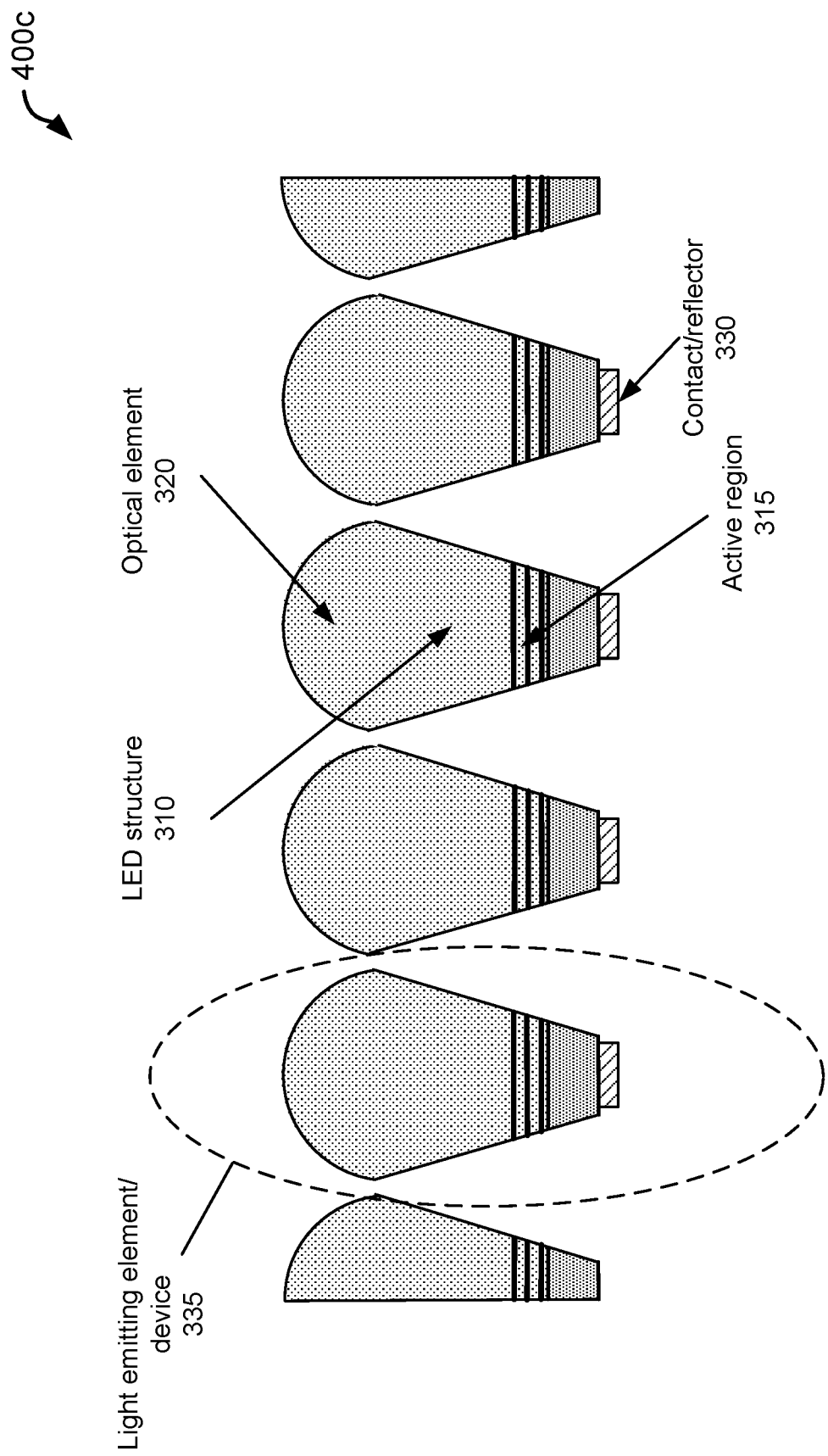

FIG. 4C shows a diagram 400c in which the structure described above in connection with the diagram 300b in FIG. 3B has been further processed (e.g., deep trench etch) to completely separate or isolate the various light emitting elements or devices 335 from each other. Moreover, the separation or isolation process resulted in the light emitting elements or devices 335 having tapered sidewalls, where the angle of the tapered sidewalls may vary depending of the separation or isolation processes. Each of these separated or isolated light emitting elements 335 include an optical element 320 integrated (e.g., monolithically integrated) with an LED structure 310 having an active region 315 (with tapered sidewalls), and a contact/reflector 330 positioned or disposed on a flat surface opposite the optical element 320. In this example, the tapering that results from the separation or isolation processes may also produce a smaller contact/reflector 330 than the ones in the diagrams 400a and 400b, for example.

The angle of the tapered sidewalls in the structures in both the diagrams 400b and 400c can be controlled to produce a desired optical performance, including the ability to produce total internal reflection of at least a portion of the light that is directed to the tapered sidewalls.

Figure 4D:
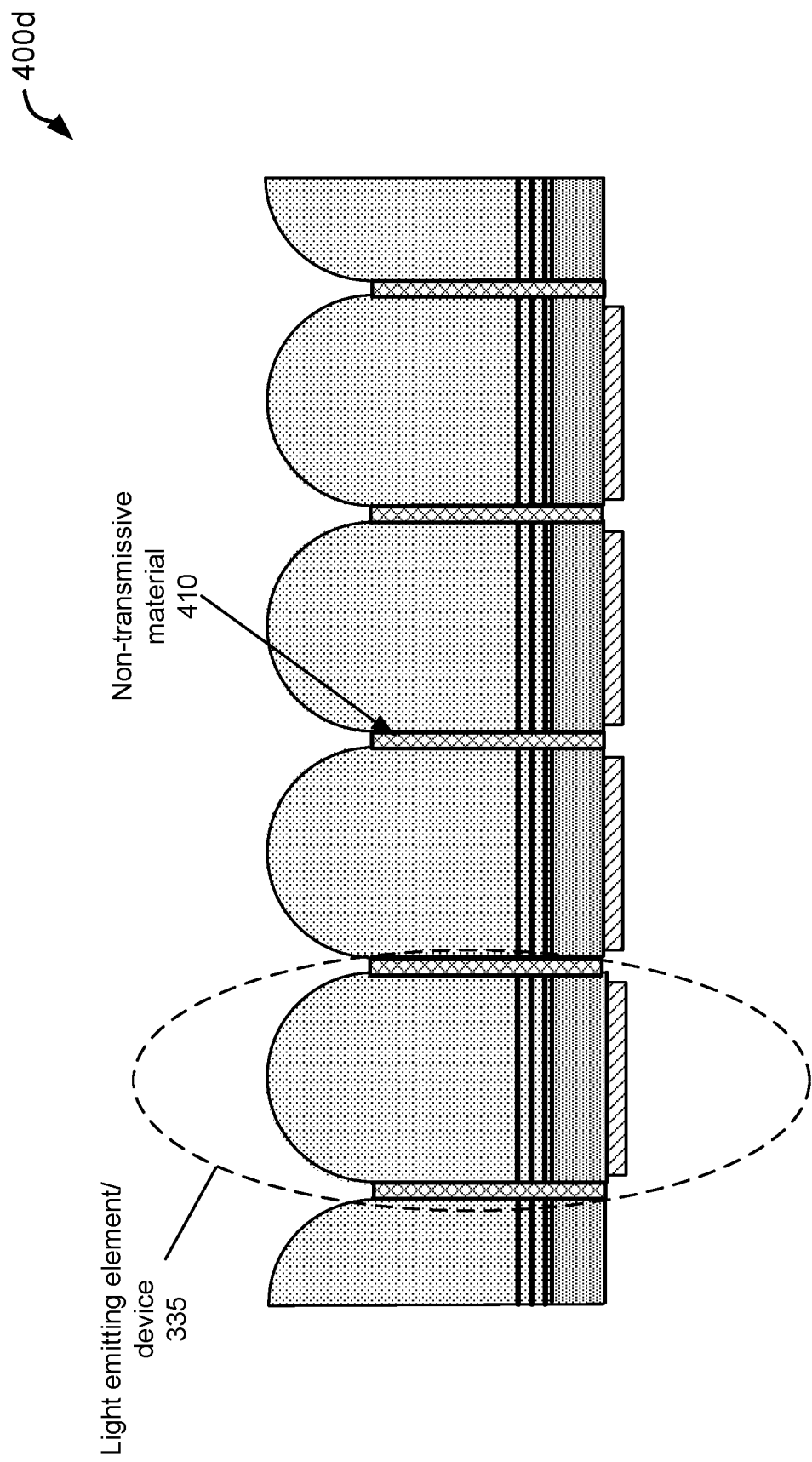
Figure 4E:
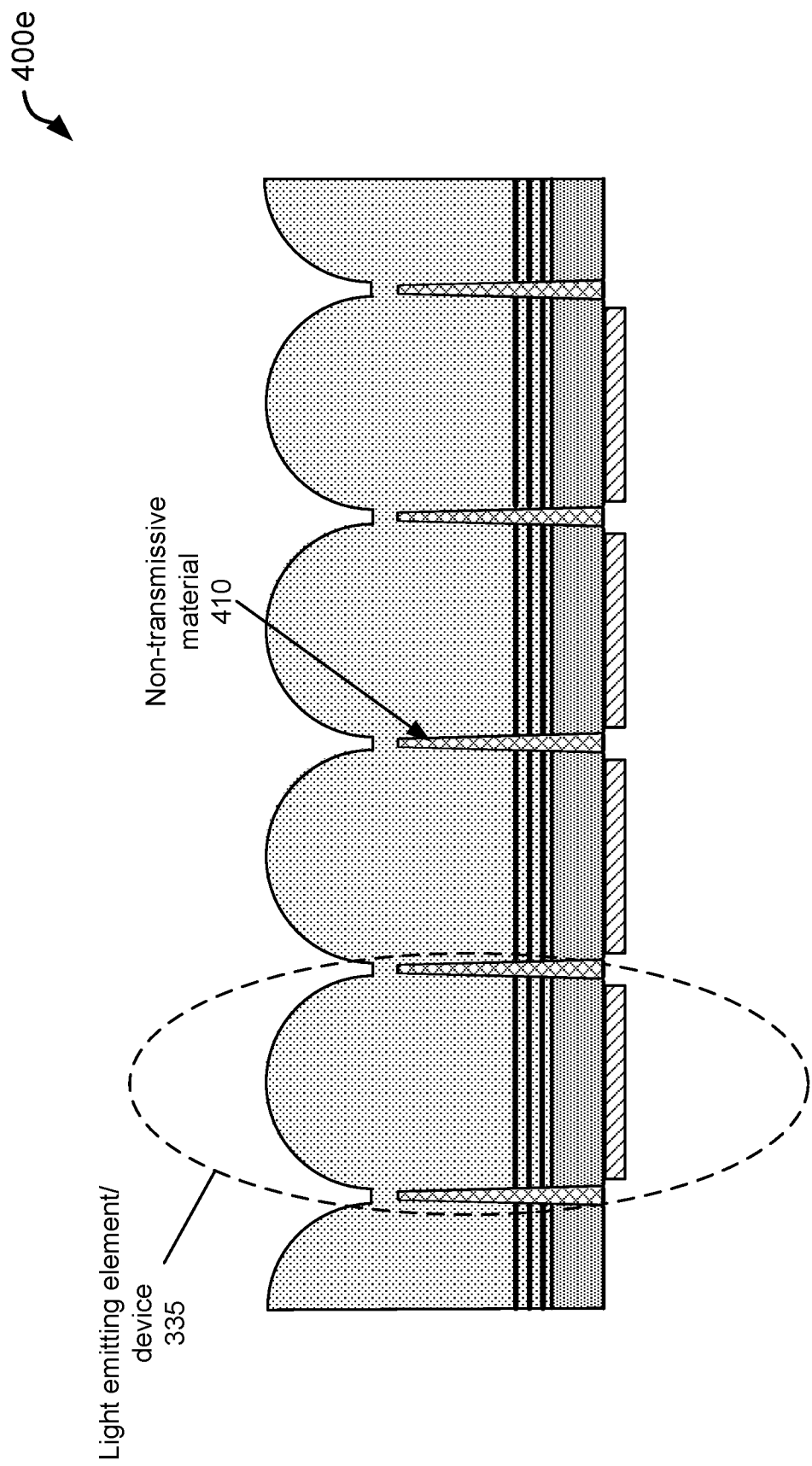

FIGS. 4D and 4E show diagrams 400d and 400e, respectively, that illustrate the structures described above in connection with the diagrams 400a and 400b but with an optically non-transmissive material 410 disposed between the light emitting elements 335 to provide optical isolation. The non-transmissive material 410 can include one or more of an opaque material, a semi-opaque material, a reflective material, a specularly reflective material, or a diffusive reflective material. Although the non-transmissive material 410 is shown disposed over the entire trench that separates or isolates the light emitting elements 335, the disclosure need not be so limited and can include instances in which the non-transmissive material 410 is disposed in only a portion of the trench that separates or isolates the light emitting elements 335.

Figure 5A:
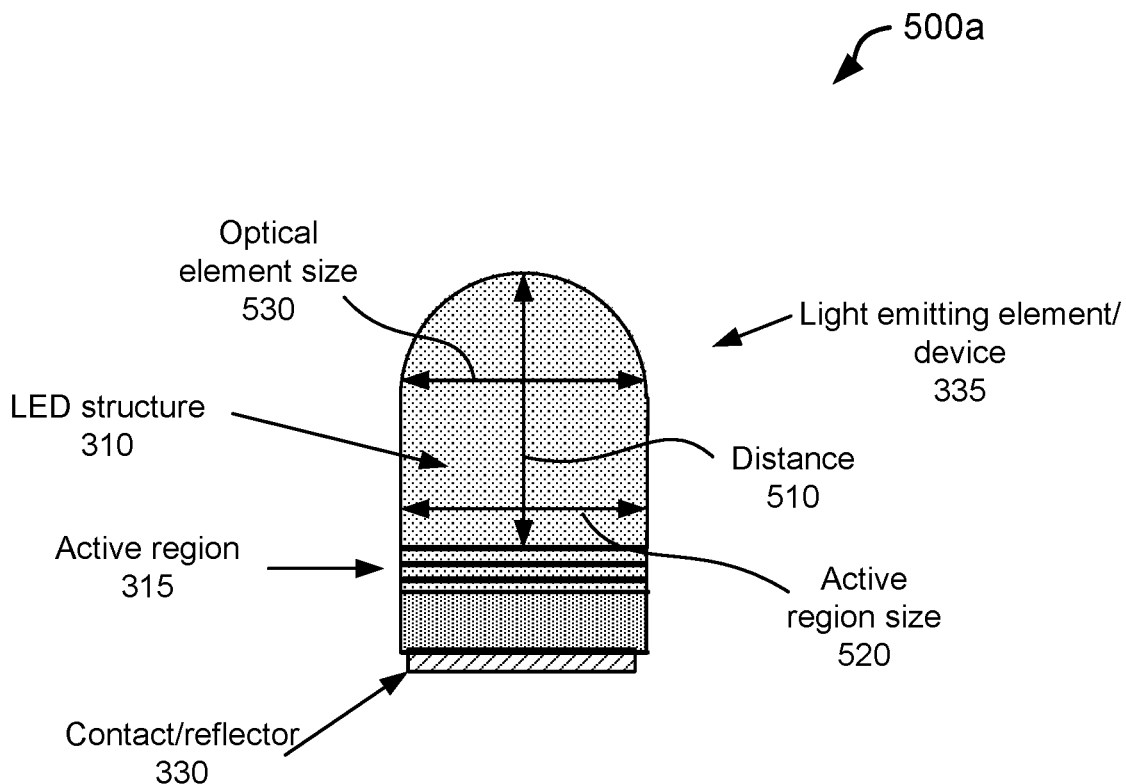
FIGS. 5A and 5B illustrate examples of relative sizes, dimensions, or features for different LED structures with integrated optical elements, in accordance with aspects of this disclosure.
Figure 5B:
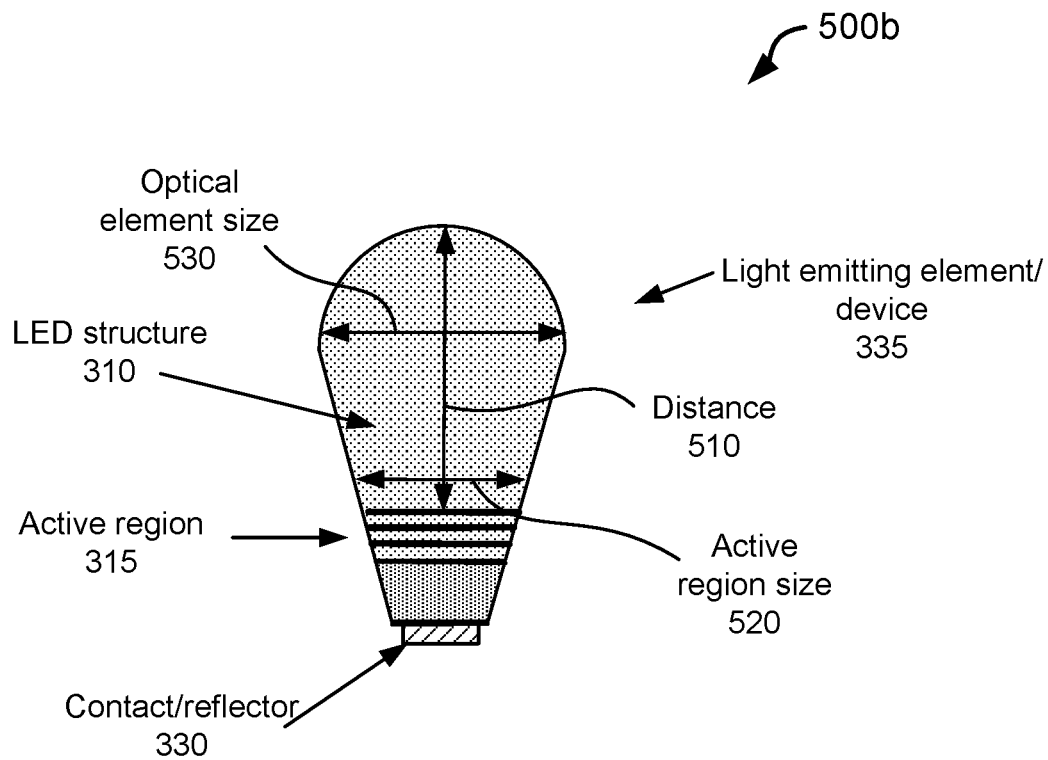

FIGS. 5A and 5B show diagrams 500a and 500b, respectively, that illustrate examples of relative sizes, dimensions, or features for different LED structures with integrated optical elements.

The diagram 500a shows an isolated light emitting element or device 335 with substantially straight sidewalls for the LED structure 310 with the active region 315. In this example, a size or dimension of the optical element (optical element size 530), such as the diameter of the lenslet or microlens, for example, can be substantially similar or the same as a size or dimension of the active region (active region size 520). In a non-limiting example, the optical element size 530 can be 3 microns and the active region size 520 can be 3 microns. In this example, a distance between the optical element and the active region (distance 510) can be in the same order of magnitude as the optical element size 530 and the active region size 520. In a non-limiting example, the distance 510 can be 4 microns. Moreover, the distance 510 can be implemented to be such that the active region is positioned or located at the focal point of the optical element, for example.

The diagram 500b shows an isolated light emitting element or device 335 with tapered sidewalls for the LED structure 310 with the active region 315. In this example, a size or dimension of the optical element (optical element size 530), such as the diameter of the lenslet or microlens, for example, can be greater than a size or dimension of the active region (active region size 520). In a non-limiting example, the optical element size 530 can be 3 microns and the active region size 520 can be 1 micron. In this example, a distance between the optical element and the active region (distance 510) can be in the same order of magnitude as the optical element size 530 and the active region size 520. In a non-limiting example, the distance 510 can be 4 microns. Moreover, the distance 510 can be implemented to be such that the active region is positioned or located at the focal point of the optical element, for example.

The distance 510 can have different ranges for different sized LED structures. For example, the distance 510 can range from 100 nm to 2 microns, from 0.5 microns to 3 microns, from 1 micron to 10 microns, from 1 micron to 20 microns, from 1 micron to 25 microns, from 1 micron to 50 microns, or from 10 microns to 100 microns.

For larger LED structures, for example those having the optical element size 530 greater than 10 microns or greater than 100 microns, which may therefore require the distance 510a to also be greater than 10 microns or greater than 100 microns in order to produce the needed curvature for the optical element 320, then at least part of the optical element 320 and/or the LED structure 310 may include a substrate material that would allow sufficient thickness for the distance 510a.

Figure 6A:
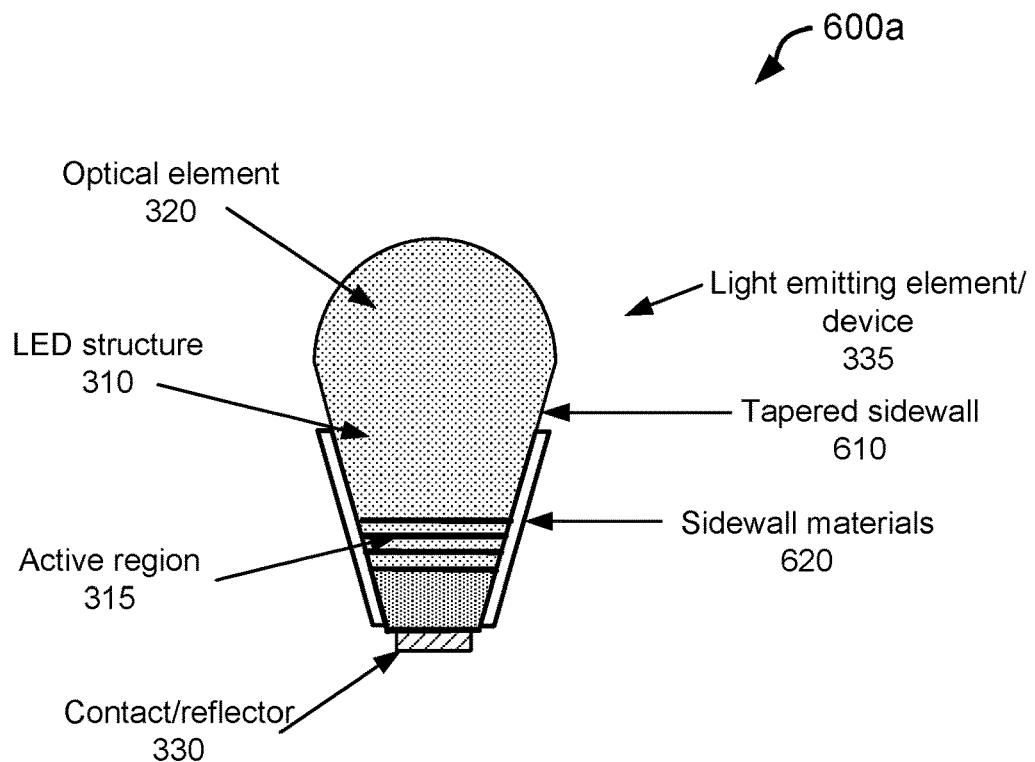
FIGS. 6A-6D illustrate examples of LED structures with integrated optical elements and coated tapered sidewalls, in accordance with aspects of this disclosure.
Figure 6B:
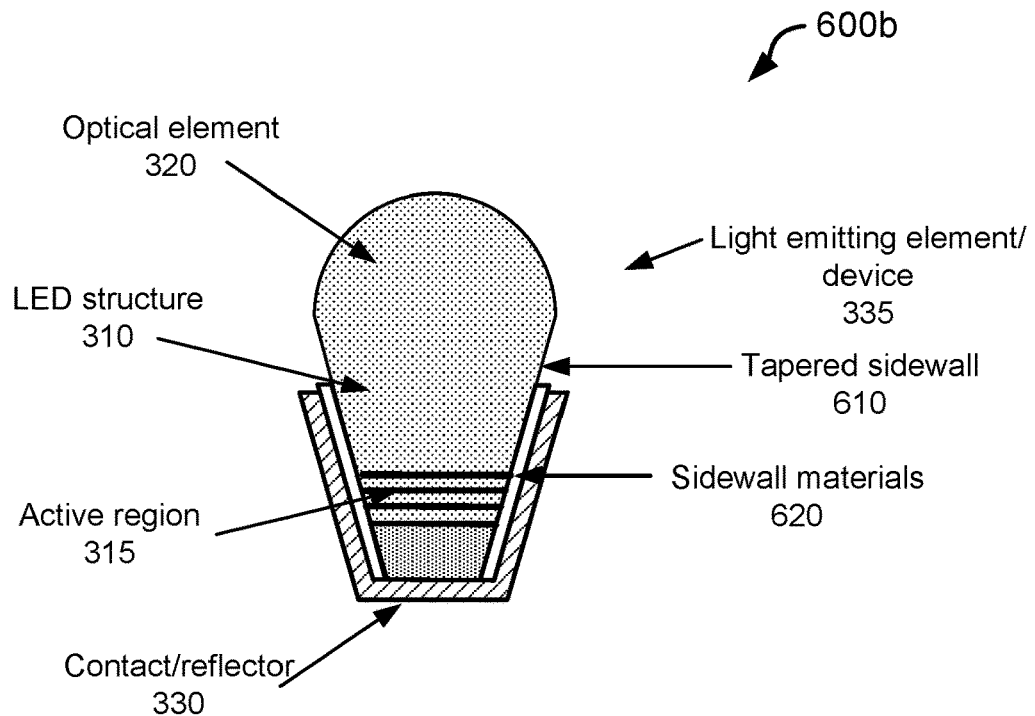

FIGS. 6A and 6B show diagrams 600a and 600b, respectively, that illustrate examples of LED structures with integrated optical elements and coated tapered sidewalls.

The diagram 600a shows an isolated light emitting element or device 335 having an optical element 320 integrated with an LED structure 310 having an active region 315, and also having a contact/reflector 330 disposed on a flat surface opposite the optical element 320. In this example, the light emitting element or device 335 has tapered sidewalls (tapered sidewall 610) on which sidewall materials 620 can be deposited or coated. The sidewall materials 620 may cover a portion of the tapered sidewall 620. It is to be understood that the diagram 600a is a cross-sectional view and the sidewall materials 620 may be deposited or coated to cover around the tapered sidewall 620 (e.g., around a conical shape formed by the tapered sidewall 620). In an example, the sidewall materials 620 may include one or more of an absorber material, a dielectric material, or a metallic material. In another example, the sidewall materials 620 may include one or more of a non-reflective material, a material having angular dependent reflectivity, or a highly reflective material. In some implementations, different types of sidewall materials 620 may be disposed on different parts of the tapered sidewall 610. The sidewall materials 620 disposed on the tapered sidewalls 610 can be collectively configured to redirect at least a portion of light emitted by the LED structure 310 (or by its active region 315) towards the optical element 320.

The diagram 600b shows a similar element or device to the isolated light emitting element or device 335 described above in connection with the diagram 600a. In this case, however, the contact/reflector 330 can be extended to cover or surround at least a portion of the sidewall materials 620 and therefore provide a larger contact area and/or reflecting area.

Figure 6C:
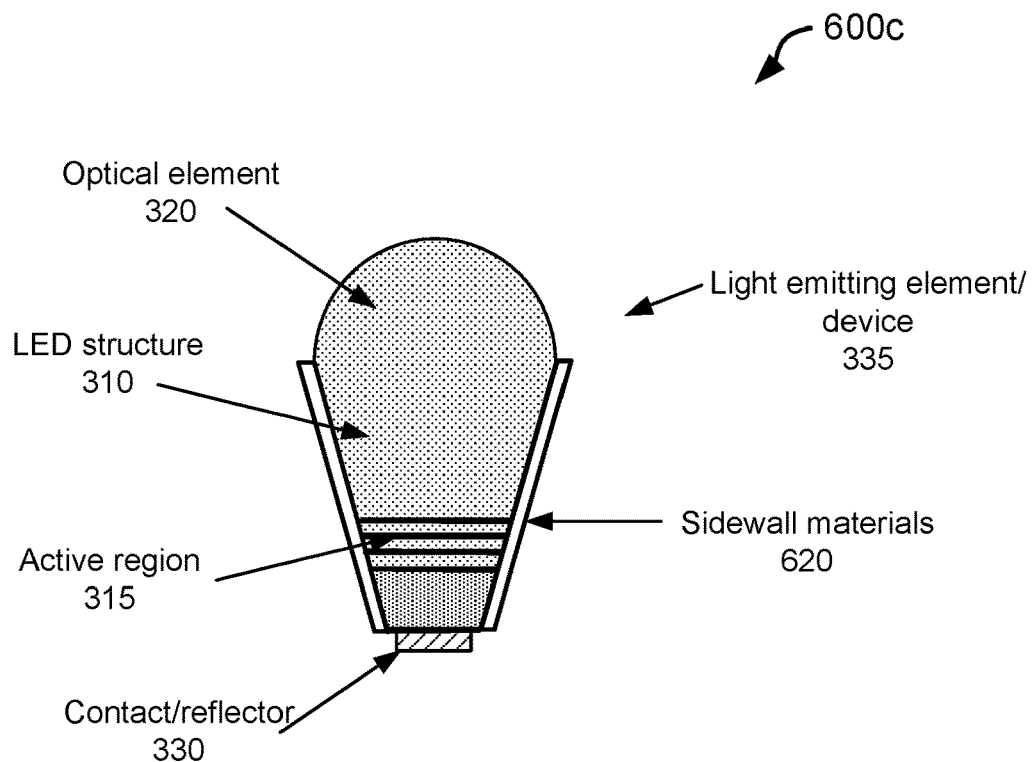
Figure 6D:
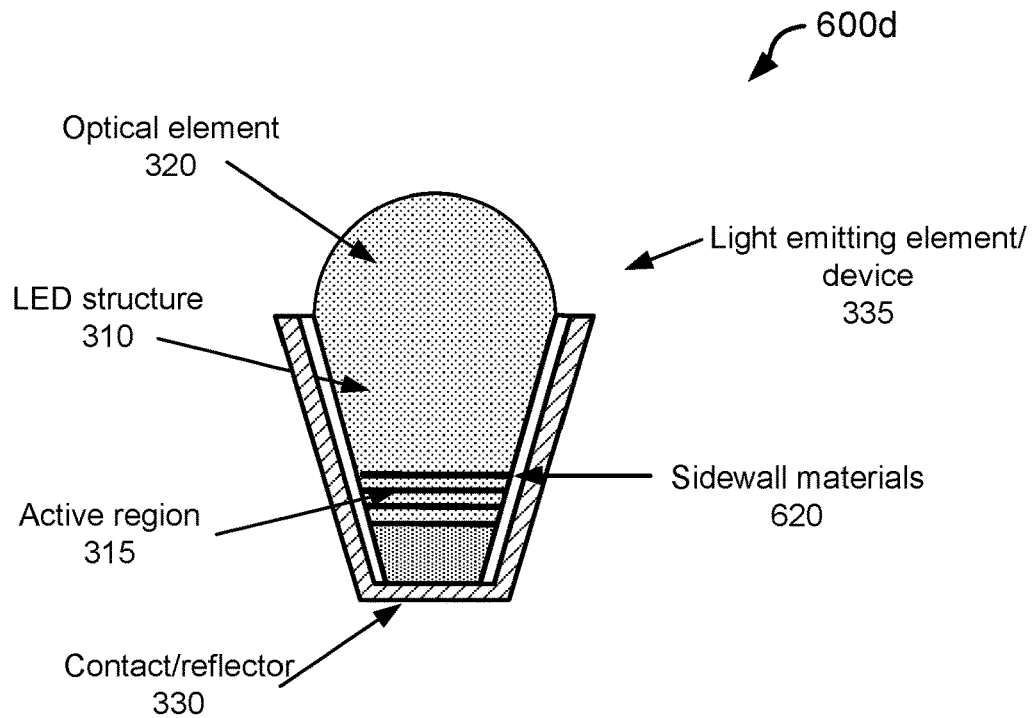

FIGS. 6C and 6D show diagrams 600c and 600d, respectively, that illustrate the structures described above in connection with the diagrams 600a and 600b where the tapered sidewalls are coated with sidewall materials 620 and/or the contact/reflector 330 all the way up to the optical element 320.

Figure 7A:
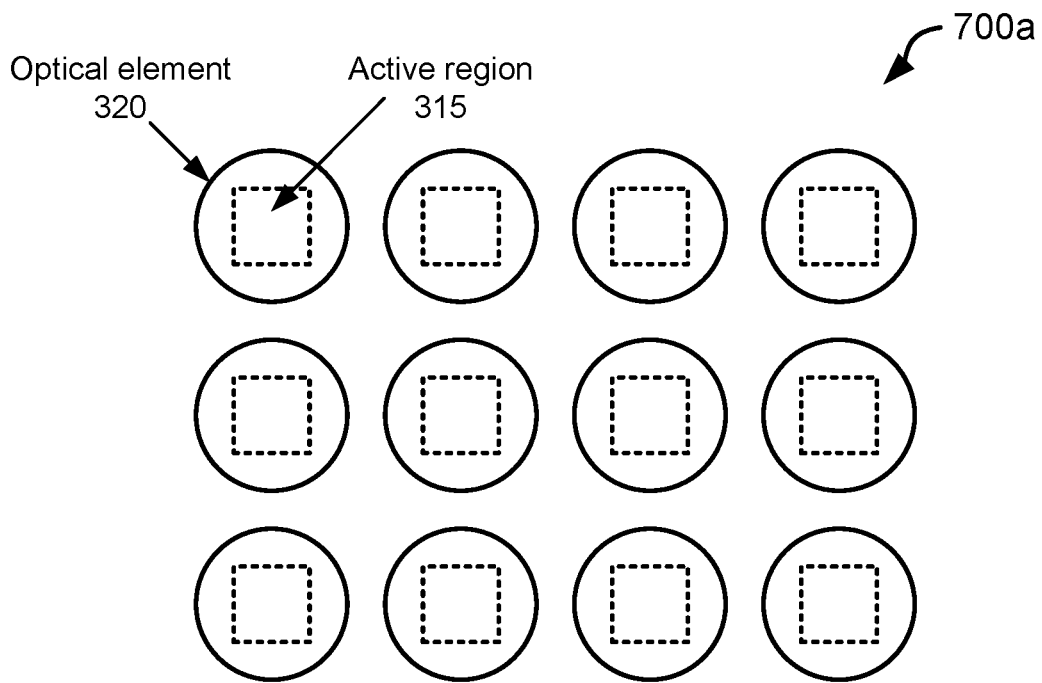
FIGS. 7A and 7B illustrate top views of examples of arrays of LED structures with integrated optical elements, in accordance with aspects of this disclosure.

A diagram 700a is shown in FIG. 7A to illustrate a top view of an example of an array of LED structures with integrated optical elements. In this example, the configuration shown is that of one optical element 320 (or optical element 205 in FIG. 2A) integrated with one LED structure (represented by the respective active region 315 of the LED structure), although a similar aspect can be illustrated with a configuration in which there are multiple optical elements to one LED structure or multiple LED structures to one optical element. Further to this example, the array is a square or rectangular array, which can be implemented to allow for close or compact arrangement of the various elements.

Figure 7B:
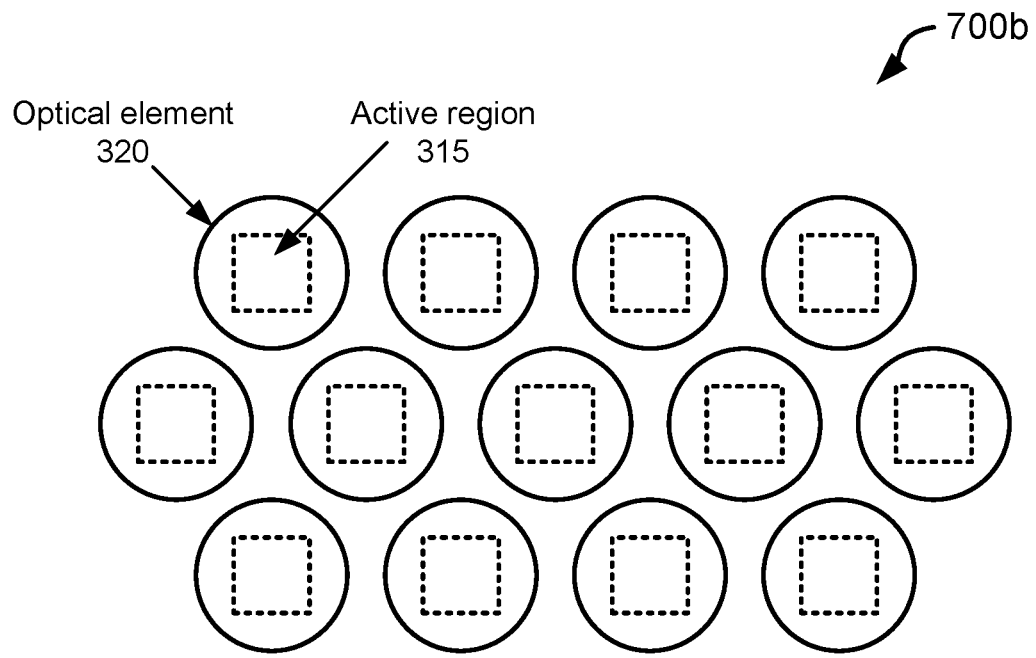

A diagram 700b is shown in FIG. 7B to illustrate a top view of another example of an array of LED structures with integrated optical elements. In this example, the configuration shown is again that of one optical element 320 (or optical element 205 in FIG. 2A) integrated with one LED structure (represented by the respective active region 315 of the LED structure), although a similar aspect can be illustrated with a configuration in which there are multiple optical elements to one LED structure or multiple LED structures to one optical element. Further to this example, the array is a hexagonal array, which can be implemented to allow for close or compact arrangement of the various elements.

In the diagrams 700a and 700b, top views of the active regions 315 are shown as squares for purposes of illustration and not of limitation. The active regions 315 may be of a shape different from a square shape and may or may need be of a same size as a size of the corresponding optical element 320. Moreover, top views of the optical elements 320 shows them a circular for purposes of illustration and not of limitation. While a circular shape may be desirable for the optical elements 320 in some implementations, other shapes (e.g., oval shapes) may also be desirable for the optical elements 320 in other implementations. Moreover, in some implementations, the shape of the optical elements 320 may vary based on a location or position of the optical element 320 in an array of light emitting devices.

Figure 8A:
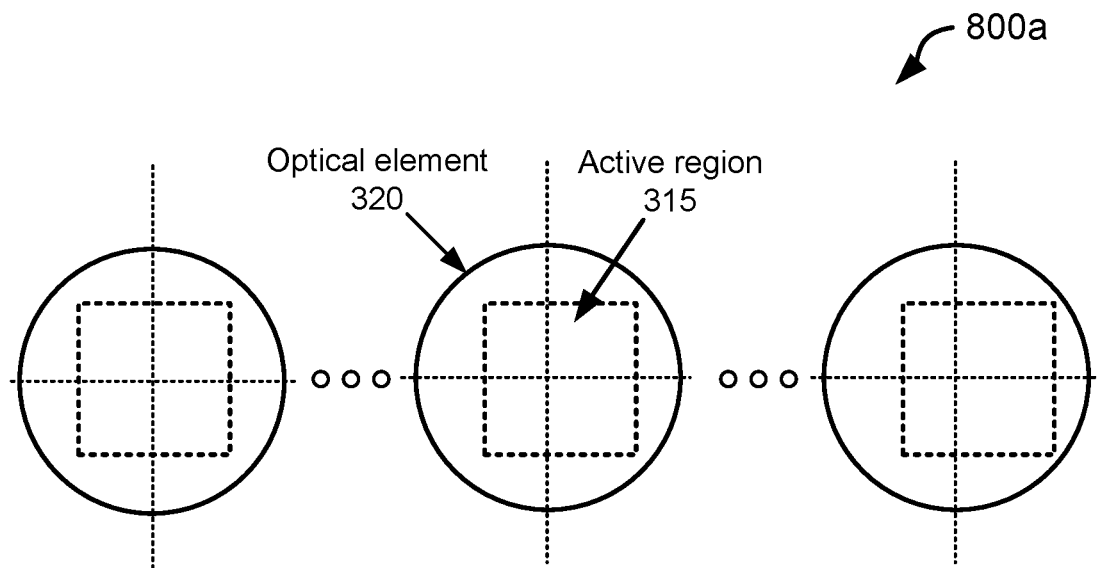
FIG. 8A illustrates a top view of an example of an offset between an active region of an LED structure and its corresponding integrated optical element, in accordance with aspects of this disclosure.

FIG. 8A shows a diagram 800a with an example of an offset between an active region of an LED structure and its corresponding integrated optical element.

In the diagram 800a, a top view shows how an offset (e.g., difference between a position of the center of the optical element 320 and a position of the center of the active region 315 or the portion of the active region 315 that generates light) can vary depending on where in an array of light emitting elements/devices the active region 315 and the optical element 320 are located. In this example, the offset may increase the further away from the center of the array of light emitting elements/devices the active region 315/optical element 320 are located.

Figure 8B:
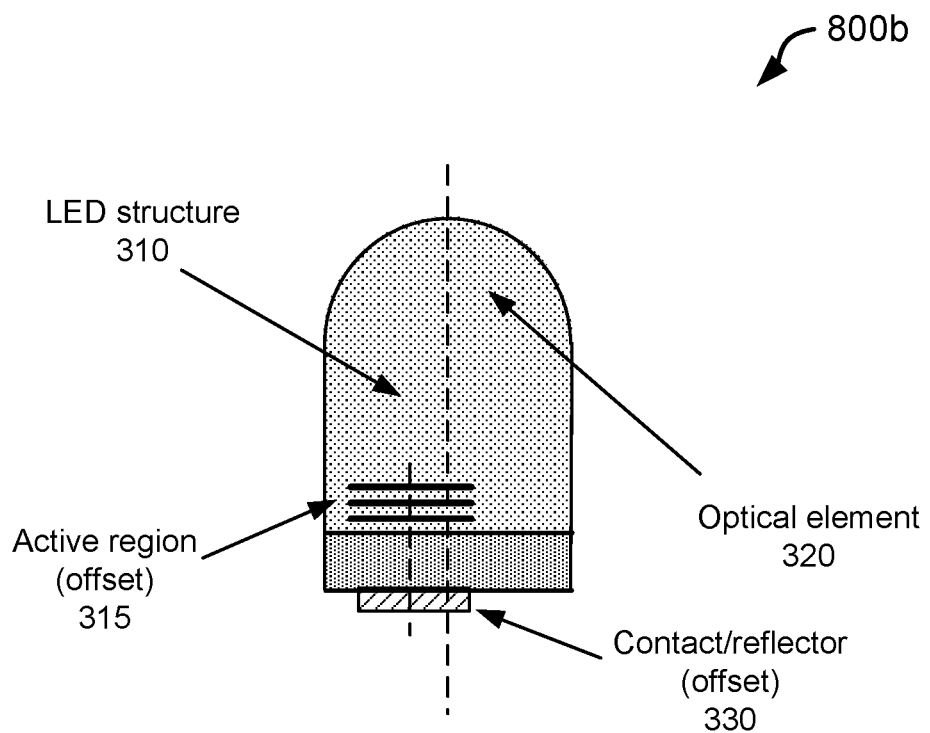
FIGS. 8B-8D illustrate cross-sectional views of examples of offsets between an active region of an LED structure and its corresponding integrated optical element, in accordance with aspects of this disclosure.
Figure 8C:
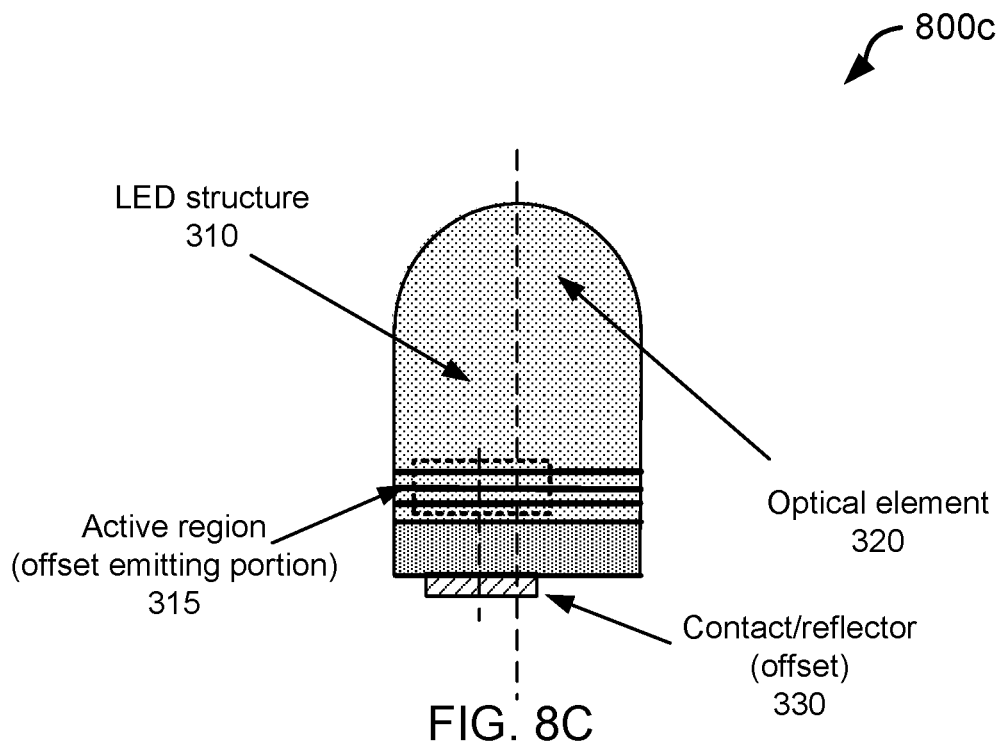
Figure 8D:
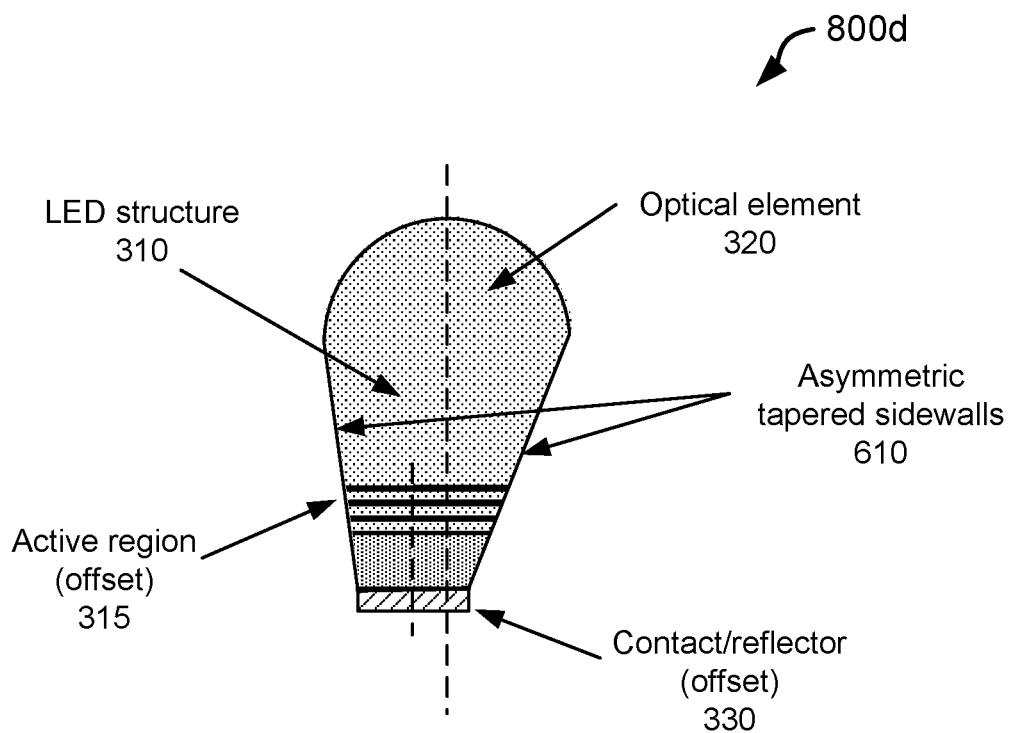

FIGS. 8B-8D show diagrams 800b, 800c and 800d, respectively, that illustrate cross-sectional views of offsets between an active region 315 of an LED structure 310 and the optical element 320. In the diagram 800b, the active region 315 covers only a portion of the width of the LED structure 310 and so does the contact/reflector 330, with both being offset from a center of the LED structure 310. In the diagram 800c the active region 315 covers the width of the LED structure 310 and the contact/reflector 330 only a portion, with the contact/reflector 330 being offset from a center of the LED structure 310. In this case, however, the portion of the active region 315 close to the contact/reflector 330 is the only portion that produces light (see e.g., dotted lines around offset light emitting portion of the active region 315), effectively offsetting the light production in a manner similar to that in the diagram 800b. In the diagram 800d, the active region 315 is at least partially offset, along with the contact/reflector 330, as defined by the asymmetric tapered sidewalls 610 of the LED structure 310. The asymmetric effectively produces an offsetting of the light production relative to the center of the optical element 320.

Figure 9:
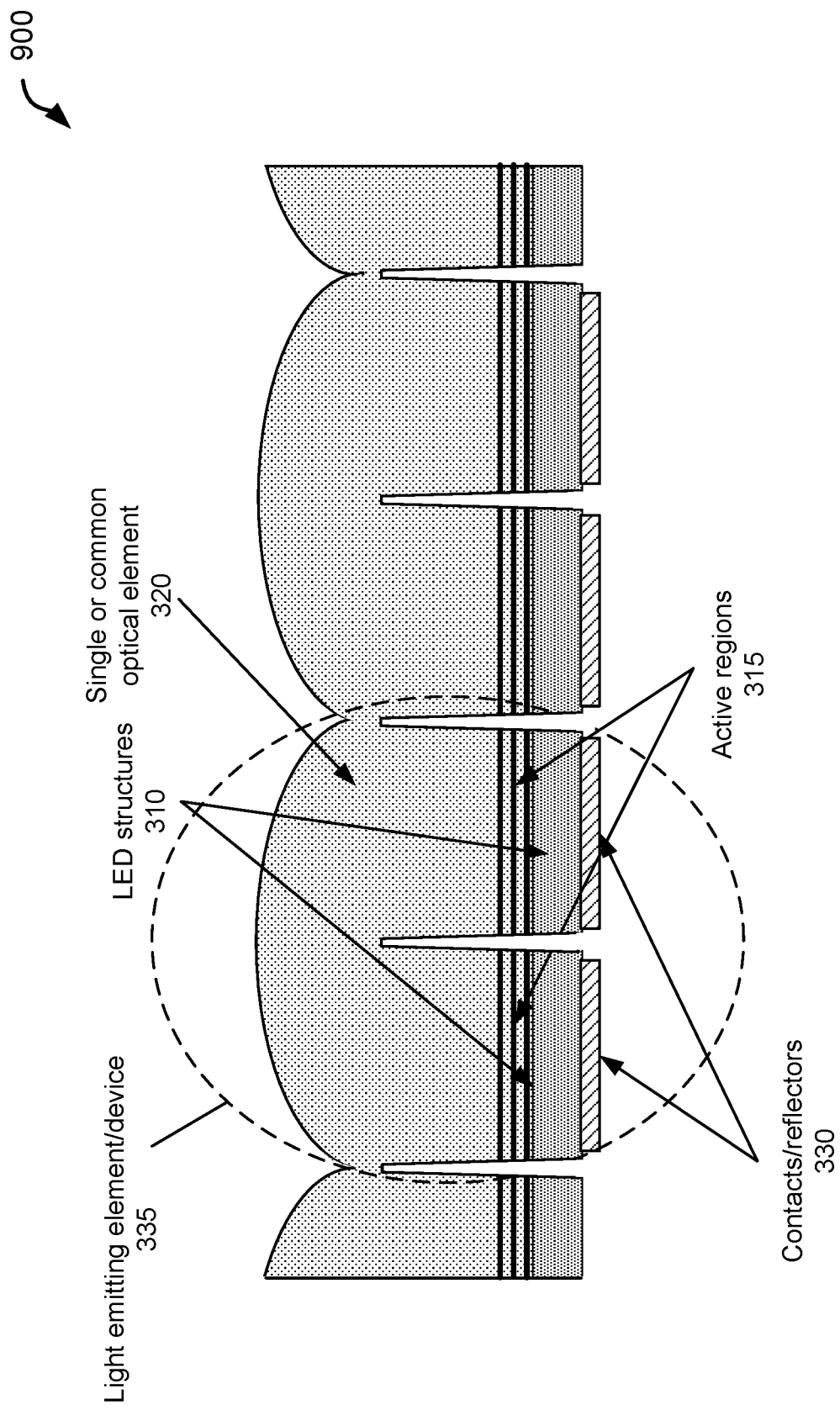
FIG. 9 illustrates a cross-sectional view of an example of multiple LED structures with a single optical element, in accordance with aspects of this disclosure.
Figure 10A:
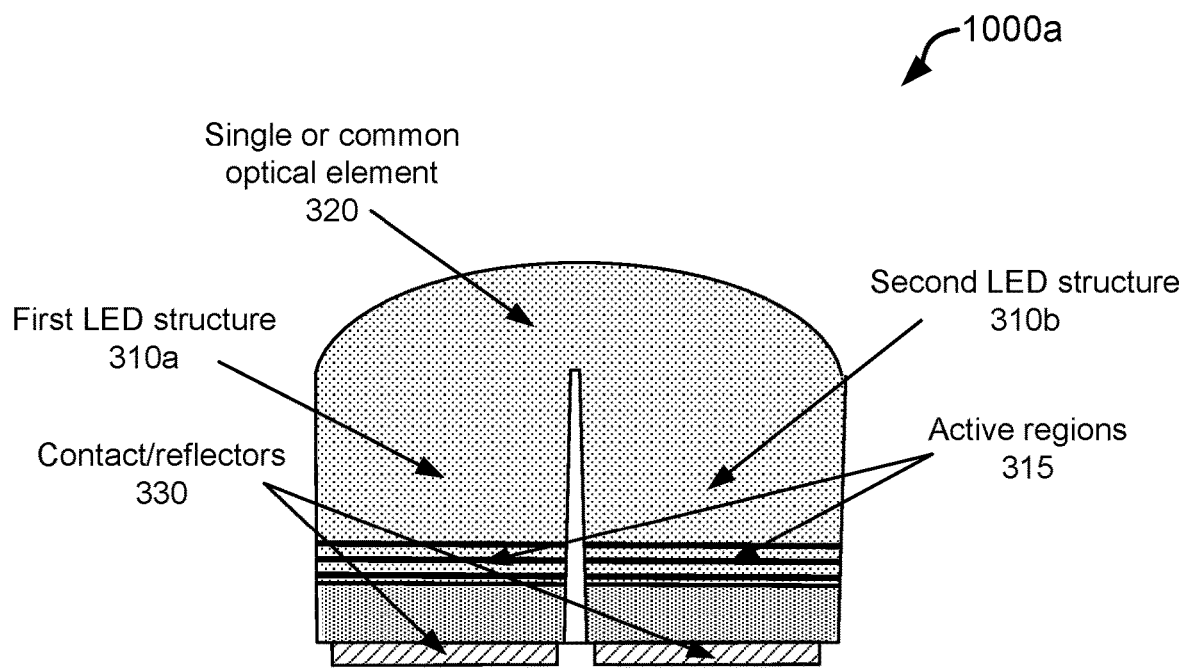
FIG. 10A illustrates a cross-sectional view of another example of multiple LED structures with a single integrated optical element, in accordance with aspects of this disclosure.

A diagram 900 in FIG. 9 illustrates a cross-sectional view of an example of multiple LED structures with a single or common optical element In contrast to the example described above in connection with the diagram 300b in FIG. 3B, the light emitting element/device 335 includes a single optical element 320 that is integrated with multiple LED structures 310. This is similar to the configuration described above in connection with the diagram 200c in FIG. 2C. A diagram 1000a shown in FIG. 10A illustrates a separated or isolated light emitting element/device 335 as described in the diagram 900 in which a single or common optical element 320 is integrated with two LED structures (e.g., a first LED structure 310a and a second LED structure 310b), where each of the LED structures has a corresponding active region 315 and contact/reflector 330, and where the LED structures with the active regions 315 have tapered sidewalls. Although only two LED structures are shown in the example described in the diagram 1000a, it is to be understood that other implementation may involve more than two LED structures sharing the same optical element 320. Moreover, the two LED structures are depicted as being similar to each other, however, there may be implementations in which certain features of one LED structure may be different from the features of the other LED structure.

Figure 10B:
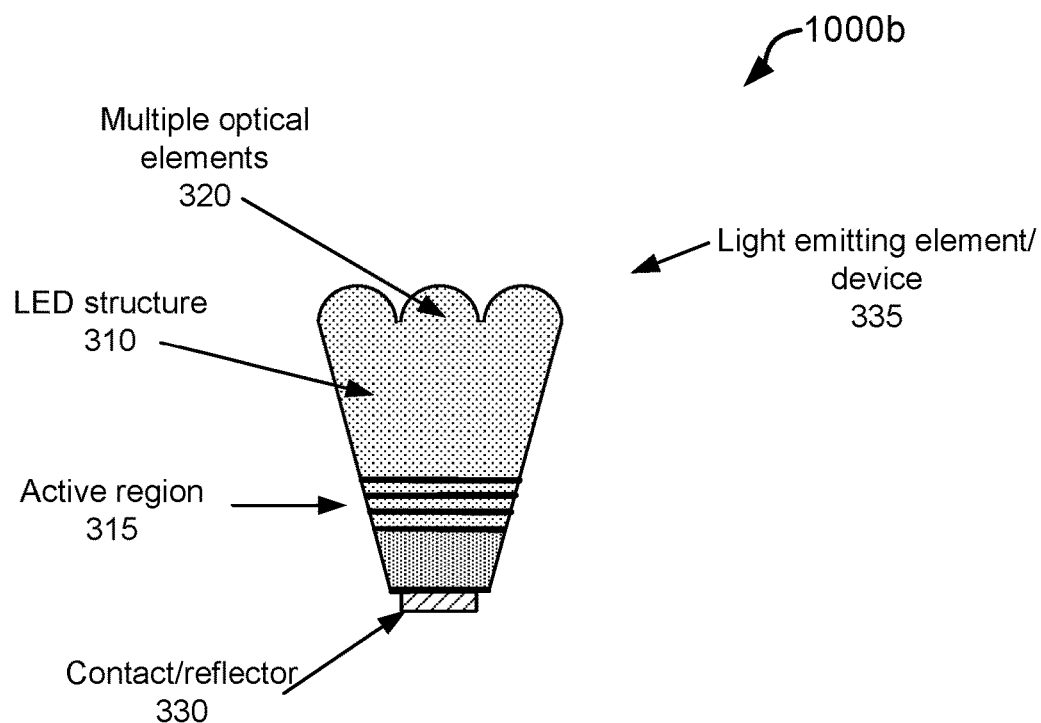
FIG. 10B illustrates a cross-sectional view of an example of an LED structure with multiple integrated optical elements, in accordance with aspects of this disclosure.

A diagram 1000b shown in FIG. 10B illustrates an isolated light emitting element/device having a configuration in which multiple optical elements 320 are integrated with a single LED structure 310. This is similar to the configuration described above in connection with the diagram 200b in FIG. 2B. Although the individual optical elements 320 in the diagram 1000b are depicted as having a similar shape and/or size, there may be implementations in which the shapes and/or the sizes of the various optical elements 320 integrated into a single LED structure 310 are different.

Figure 11A:
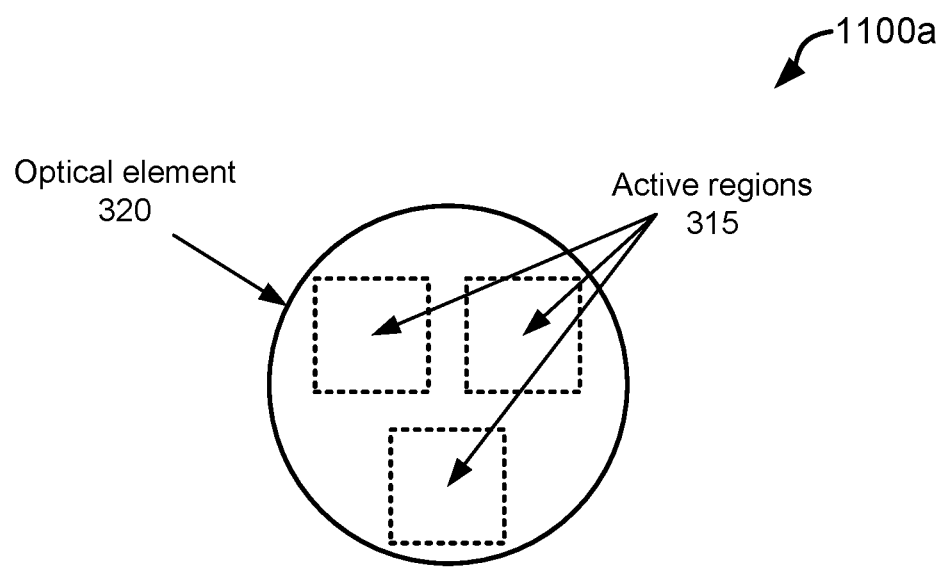
FIG. 11A illustrates a top view of an example of multiple LED structures with a single integrated optical element, in accordance with aspects of this disclosure.

FIG. 11A shows a diagram 1100a that illustrates a top view of a configuration described above (see e.g., the diagrams 200c, 900, and 1000a in FIGS. 2C, 9, and 10A, respectively) where there are two or more LED structures (represented by their respective active regions 315) integrated with a single or common optical element 320. In some implementations, a configuration that uses multiple LED structures 310 (and therefore multiple active regions 315) may have the active regions 315 be equidistant from each other. When the two or more LED structures include LED structures that generate light of different colors, the group of LED structures may be considered to be a raxel as described above in the diagram 200f in FIG. 2F. As such, it is therefore possible to have a light emitting element/device with a single optical element 320 and multiple LEDs that logically operates like a group of individual light emitting elements.

Figure 11B:
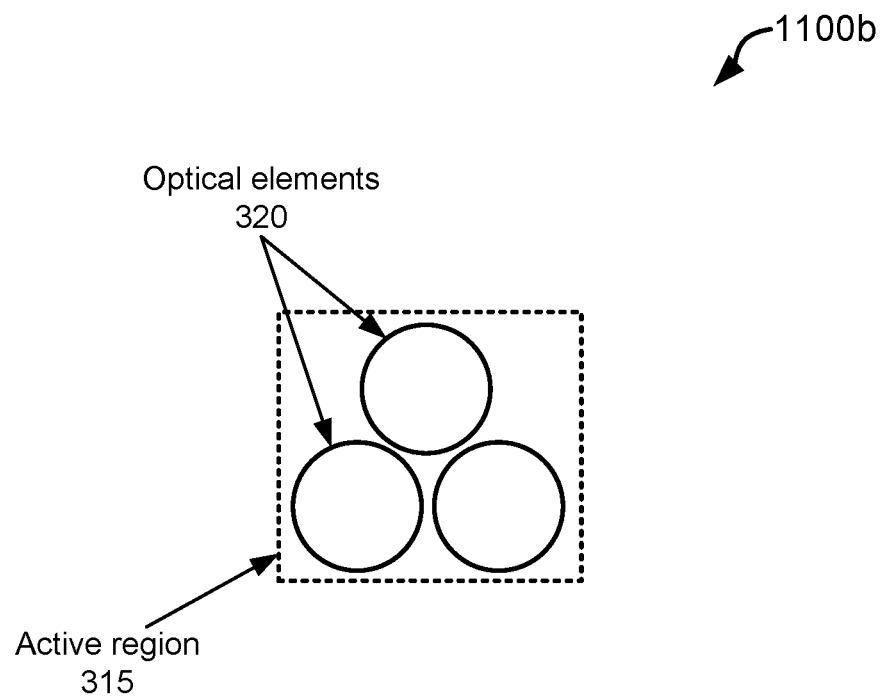
FIG. 11B illustrates a top view of an example of an LED structure with multiple integrated optical elements, in accordance with aspects of this disclosure.

On the other hand, FIG. 11B shows a diagram 1100b that illustrates a top view of another configuration described above (see e.g., the diagrams 200b and 1000b in FIGS. 2B and 10B, respectively) where there are two or more optical elements 320 integrated onto a single LED structure (represented by its respective active region 315).

Figure 11C:
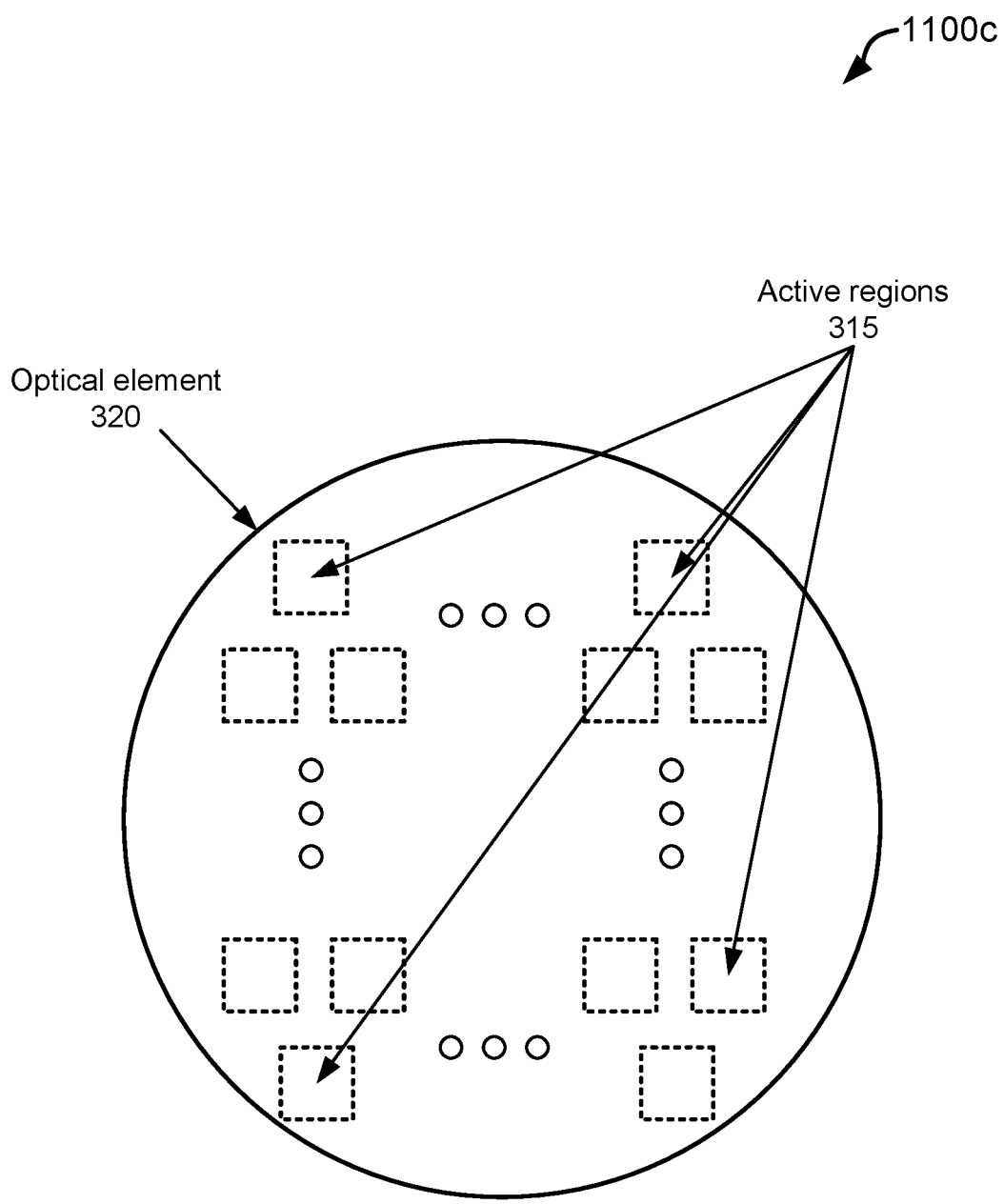
FIG. 11C illustrates a top view of another example of multiple LED structures with a single integrated optical element, in accordance with aspects of this disclosure.

FIG. 11C shows a diagram 1100c that illustrates yet another top view in which there can be a multiple LED structures (represented by their respective active regions 315) integrated with a single or common optical element 320. In some implementations, the LED structures integrated with the one optical element 320 can represent a separate physical and/or logical group, such as a separate group of the light emitting elements 220 (e.g., a raxel) in an array of such elements in a lightfield display (see e.g., the diagram 200f in FIG. 2F). In some implementations, a size (e.g., diameter) of the optical element 320 can be in the order of a few microns (e.g., 1 or 2 microns) and a size of the LED structures can be in the order of 100 nanometers (e.g., between 100 and 200 nanometers) such that there may be tens or hundreds of LED structures integrated with the one optical element 320. For example, a number of LED structures associated with a single or common optical element 320 can range from 10 to 200 LED structures.

Figure 12:
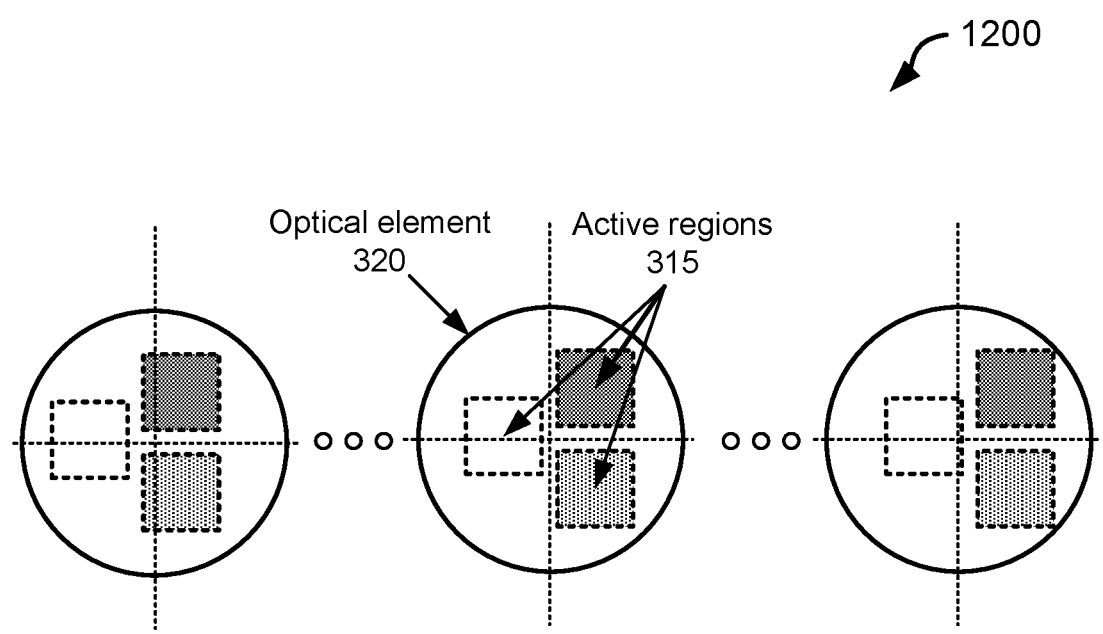
FIG. 12 illustrates a top view of an example of offsets between active regions of an LED structure and their corresponding integrated optical element, in accordance with aspects of this disclosure.

FIG. 12 shows a diagram 1200 that illustrates a top view of an example of offsets between active regions 315 of LED structures and their common integrated optical element 320 as described in, for example, the configuration shown in the diagram 1100a in FIG. 11A. In the diagram 1200, the top view shows how an offset (e.g., difference between a position of the center of the optical element 320 and a position of the center of the active regions 315) can vary depending on where in an array of light emitting elements/devices the active regions 315 and the optical element 320 are located. In this example, the offset may increase the further away from the center of the array of light emitting elements/devices the active regions 315/optical element 320 are located.

Figure 13A:
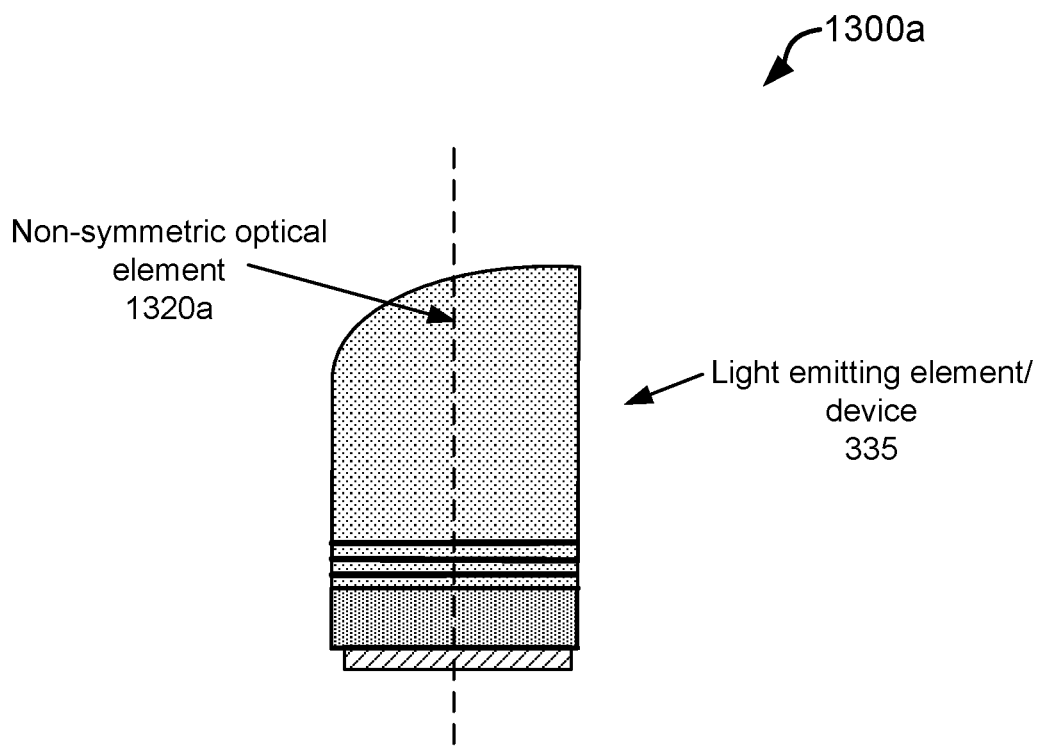
FIGS. 13A and 13B illustrate cross-sectional views of an LED structure with an integrated non-symmetric or asymmetric optical element, in accordance with aspects of this disclosure.
Figure 13B:
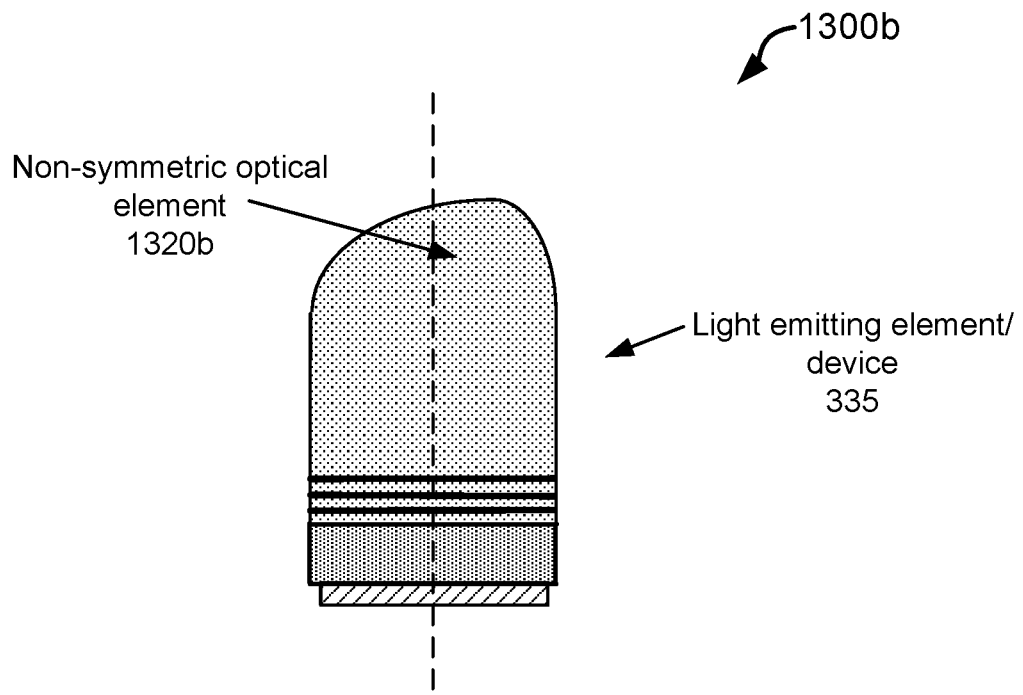

FIGS. 13A and 13B shows diagrams 1300a and 1300b, respectively, that illustrate cross-sectional views of an LED structure with an integrated non-symmetric or asymmetric optical element. In the diagram 1300a, the optical element that is shown is one example of a non-symmetric or asymmetric optical element 1320a that is not symmetric about a center of the light emitting element/device 335. The diagram 1300b simply shows another example of a non-symmetric or asymmetric optical element 1320a that is not symmetric about a center of the light emitting element/device 335.

Figure 14:
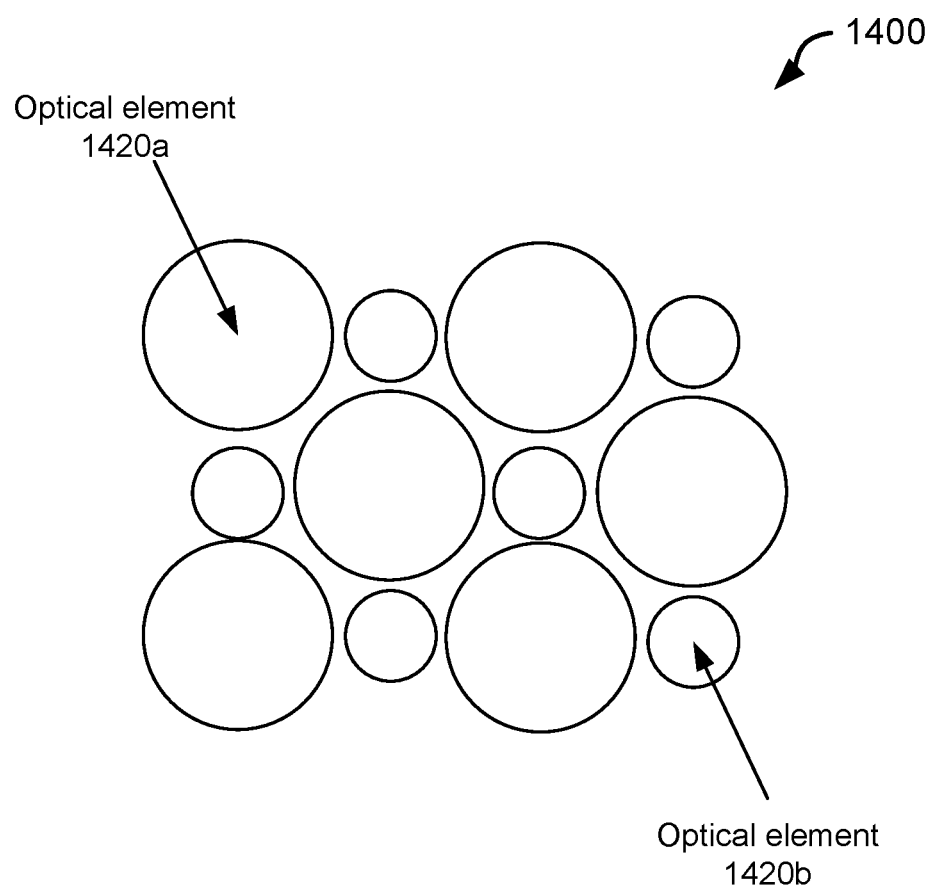
FIG. 14 illustrates a top view of an example where adjacent integrated optical elements are of different sizes, in accordance with aspects of this disclosure.

FIG. 14 illustrates a diagram 1400 of a top view of an example where adjacent integrated optical elements are of different sizes. In this example, an optical element 1420a (which may be an example of the optical elements 205 and 320 described above) is larger than an optical element 1420b (which may also be an example of the optical elements 205 and 320 described above). In one implementation, the optical element 1420a may be integrated with two or more LED structures and the optical element 1420b may be integrated with a single LED structure. In such implementation, the optical element 1420a may be used to steer light generated by one of the LED structures into one half of a light steering optical element 215 (as illustrated in FIGS. 2E and 2F) and steer the light generated by the other LED structure into the other half of the light steering optical element 215. The optical element 1420b may then be used to steer the light generated by its corresponding LED structure onto the entire light steering optical element 215. This approach may provide a scheme to support high resolution from a viewer's perspective at both near and far projections of the light.

In connection with the description provided above in FIGS. 1-14, the present disclosure describes a first implementation of a light emitting device (e.g., the light emitting element/device 335) that includes an LED structure (e.g., the LED structure 310) having an active region (e.g., the active region 315) and made of a material including GaN, where the active region has a p-side and an n-side (e.g., the n-side 316, the p-side 317). The light emitting device also includes an optical element (e.g., the optical element 320) disposed on the LED structure and made at least in part of a material including GaN, where the optical element is configured to collimate and steer light that is generated and emitted by the LED structure. Further, the light emitting device includes a reflective contact (e.g., the contact/reflector 330) disposed opposite to the optical element (e.g., as illustrated in FIG. 3B).

In this first implementation of a light emitting device, the optical element is disposed closest to the n-side of the active region, and the reflective contact is disposed closest to the p-side of the active region (e.g., as illustrated in FIG. 3A).

In this first implementation of the light emitting device, the optical element is a convex lens. A shape of the optical element is one of a hemispherical shape or an aspherical shape, where the aspherical shape is one of a hyperbolic shape, an ellipsoidal shape, or a parabolic shape.

In this first implementation of the light emitting device a size, dimension, or feature of the active region is smaller than a size of the optical element (e.g., as illustrated in FIG. 5B), or a size, dimension, or feature of the active region is substantially the same or the same as a size of the optical element (e.g., as illustrated in FIG. 5A).

In this first implementation of the light emitting device, a shape of the optical element is asymmetric or non-symmetric to steer the light emitted by the LED structure in a particular direction (e.g., as illustrated in FIGS. 13A and 13B). In some examples, the asymmetric shape of the optical element and the particular direction are based on a position of the light emitting device in an array of light emitting devices. Moreover, the particular direction that the asymmetric shape of the optical element steers the light emitted by the LED structure is towards a center of the array of light emitting devices.

In this first implementation of the light emitting device, the optical element has a submicron size (e.g., diameter of the optical element is less than one micron). In some examples, a size, dimension, or feature of the optical element (e.g., the diameter) ranges from 100 nanometers (nm) to 100 microns and this range includes one or more of the following subranges: 100 nm to 2 microns, 1 micron to 5 microns, 100 nm to 5 microns, 500 nm to 5 microns, 200 nm to 5 microns, 5 microns to 10 microns, 10 microns to 50 microns, or 25 microns to 100 microns, for example. In another example, a distance from the optical element to the active region (e.g., the distance 510) includes one or more of the following ranges: 100 nm to 2 microns, 0.5 microns to 3 microns, 1 micron to 10 microns, 1 micron to 20 microns, 1 micron to 25 microns, 1 micron to 50 microns, or 10 microns to 100 microns.

In this first implementation of the light emitting device, the reflective contact (e.g., the contact/reflector 330) is an electrically conductive contact disposed on a flat surface opposite the optical element (e.g., as illustrated in FIG. 3B) and is configured to direct at least a portion of the light emitted by the LED structure towards the optical element. That is, light generated by the active region and emitted in the direction of the reflective contact is reflected by the reflected contact towards the optical element.

In this first implementation of the light emitting device, the active region (e.g., the active region 315) of the LED structure (e.g., the LED structure 310) and the optical element (e.g., the optical element 320) are part of a single crystalline material that includes GaN. In another example, the active region of the LED structure and the optical element are part of an epitaxially-grown material that includes GaN and has a continuous refractive index. In yet another example, the active region of the LED structure and the optical element are monolithically integrated.

In this first implementation of the light emitting device, a position of the active region in the LED structure corresponds to a focal point of the optical element (e.g., as illustrated in FIGS. 5A and 5B).

In this first implementation of the light emitting device the active region is laterally offset from the optical element (e.g., as illustrated in FIGS. 8A and 8B). In one example, the offset is based on a position of the light emitting device in an array of light emitting devices. That is, the amount of offset relative to a center of the optical element varies across the array of light emitting devices such that, for example, closer to the center of the array of light emitting devices the offset is smaller than farther away from the center of the array of light emitting devices. In other words, the offset can increase the farther away the light emitting device is from a center of the array of light emitting devices.

In this first implementation of the light emitting device, at least a portion of the LED structure is tapered (e.g., as illustrated in FIGS. 4B, 4C, 5B, 6A, 6B, 6C, and 6D) such that tapered sidewalls (e.g., tapered sidewalls 610) are formed around the active region of the LED structure. In this case, the light emitting device can include one or more materials (e.g., the sidewall materials 620) disposed to cover at least a portion of the tapered sidewalls (e.g., as illustrated in FIGS. 6A and 6B, with full coverage shown in FIGS. 6C and 6D). In one example, the one or more materials include one or more of an absorber material, a dielectric material, or a metallic material. In another example, the one or more materials include one or more of a non-reflective material, a material having angular dependent reflectivity, or a highly reflective material. Moreover, the one or more materials disposed on the tapered sidewalls are collectively configured to redirect at least a portion of light emitted by the LED structure towards the optical element. When more than one material are disposed on or cover a portion of the tapered sidewalls, the different materials may be disposed in different portions of the tapered sidewalls to produce the desired redirection effect.

In this first implementation of the light emitting device, the material from which the LED structure is made includes InGaN. In some cases, however, it may be possible to use other compound semiconductor materials such as AlInGaP, for example, to make the LED structure and/or the optical element.

In this first implementation of the light emitting device, the light emitting device is one of multiple light emitting devices in an array, and the array includes light emitting devices configured to produce one or more colors of light. The array can be implemented as part of a display having one or more of the following capabilities: ultra-high-resolution capabilities, high dynamic range capabilities, light-field capabilities, or high directionality (e.g., as illustrated in FIGS. 2D-2F).

In this first implementation of the light emitting device, or perhaps considered a different implementation of the light emitting device, the optical element is a first optical element, and the light emitting device further includes one or more additional optical elements (e.g., as illustrated in FIGS. 2B, 10B, and 11B) disposed on the LED structure and made at least in part of a material including GaN, the one or more additional optical elements also being configured to collimate and steer the light emitted by the LED structure. In this case, the active region (e.g., the active region 315) of the LED structure (e.g., the LED structure 310), the first optical element (e.g., one of multiple optical elements 320 as illustrated in FIG. 10B), and the one or more additional optical elements (e.g., the remaining optical elements 320 as illustrated in FIG. 10B) are part of a single crystalline material that includes GaN. In another example, the active region of the LED structure, the first optical element, and the one or more additional optical elements are part of an epitaxially-grown material that includes GaN and has a continuous refractive index. In a further example, the active region of the LED structure, the first optical element, and the one or more additional optical elements are monolithically integrated. Moreover, the light emitting device is a first light emitting device and is positioned adjacent to a second light emitting device that includes a single LED structure and a second optical element configured to collimate and steer a light emitted by the single LED structure, where the first optical element of the first light emitting device is larger than the second optical element of the second light emitting device (e.g., as illustrated in FIG. 14).

In this first implementation of the light emitting device, at least a portion of the LED structure is separated from another LED structure by a trench within which there is included an optically non-transmissive material (e.g., as illustrated in FIGS. 4D and 4E).

In connection with the description provided above in FIGS. 1-14, the present disclosure describes a second implementation of a light emitting device that includes multiple light-emitting diode (LED) structures (e.g., the first LED structure 310a and the second LED structure 310b as illustrated in FIG. 10A) each having an active region (e.g., the active regions 315) and made of a material including GaN. The light emitting device also includes an optical element (e.g., the common optical element 320 as illustrated in FIG. 10A) disposed on the multiple LED structures and made at least in part of a material including GaN, the optical element being configured to collimate and steer a light emitted by the multiple LED structures. Moreover, the light emitting device further includes, for each of the multiple LED structures, a reflective contact (e.g., the contact/reflectors 330 as illustrated in FIG. 10A) disposed opposite to the optical element.

In this second implementation of the light emitting device, the multiple LED structures include LED structures configured to produce one or more colors of light. In one example, the multiple LED structures include a first LED structure configured to produce a first color of light, a second LED structure configured to produce a second color of light, and a third LED structure configured to produce a third color of light. For this example, the first color of light is green, the second color of light is red, and the third color of light is blue, although other light colors may also be used.

In this second implementation of the light emitting device, the active region in each of the multiple LED structures includes a p-side and an n-side (e.g., as illustrated in FIG. 3A), with the optical element being disposed closest to the n-side of the active regions and the reflective contact being disposed closest to the p-side of the active regions.

In this second implementation of the light emitting device, the optical element is a convex lens. A shape of the optical element is one of a hemispherical shape or an aspherical shape, where the aspherical shape is one of a hyperbolic shape, an ellipsoidal shape, or a parabolic shape.

In this second implementation of the light emitting device, a shape of the optical element is asymmetric or non-symmetric to steer the light emitted by the LED structure in a particular direction (e.g., as illustrated in FIGS. 13A and 13B). In some examples, the asymmetric shape of the optical element and the particular direction are based on a position of the light emitting device in an array of light emitting devices. Moreover, the particular direction that the asymmetric shape of the optical element steers the light emitted by the LED structure is towards a center of the array of light emitting devices.

In this second implementation of the light emitting device, the optical element has a submicron size (e.g., diameter of the optical element is less than one micron). In some examples, a size, dimension, or feature of the optical element (e.g., the diameter) ranges from 100 nm to 100 microns and this range includes one or more of the following subranges: 100 nm to 2 microns, 1 micron to 5 microns, 100 nm to 5 microns, 500 nm to 5 microns, 200 nm to 5 microns, 5 microns to 10 microns, 10 microns to 50 microns, or 25 microns to 100 microns, for example. In another example, a distance from the optical element to the active region (e.g., the distance 510) includes one or more of the following ranges: 100 nm to 2 microns, 0.5 microns to 3 microns, 1 micron to 10 microns, 1 micron to 20 microns, 1 micron to 25 microns, 1 micron to 50 microns, or 10 microns to 100 microns.

In this second implementation of the light emitting device, for each of the multiple LED structures, the reflective contact is an electrically conductive contact disposed on a flat surface opposite the optical element and is configured to direct at least a portion of the light emitted by the respective LED structure towards the optical element (e.g., as illustrated in FIG. 10A).

In this second implementation of the light emitting device, for each of the multiple LED structures (e.g., the first LED structure 310a and the second LED structure 310b as illustrated in FIG. 10A), the active region of the respective LED structure (e.g., the active regions 315 as illustrated in FIG. 10A), and the optical element (e.g., the common optical element 320 as illustrated in FIG. 10A) are part of a single crystalline material that includes GaN. In another example, for each of the multiple LED structures, the active region of the respective LED structure and the optical element are part of an epitaxially-grown material that includes GaN and has a continuous refractive index. In yet another example, for each of the multiple LED structures, the active region of the respective LED structure and the optical element are monolithically integrated.

In this second implementation of the light emitting device, at least a portion of each of the multiple LED structures is tapered (e.g., as illustrated in FIG. 10A) such that tapered sidewalls (e.g., the tapered sidewalls 610) are formed around the active region of the respective LED structure. The light emitting device can further include one or more materials (e.g., the sidewall materials 620) disposed to cover at least a portion of the tapered sidewalls (e.g., as illustrated in FIGS. 6A and 6B, with full coverage shown in FIGS. 6C and 6D). In one example, the one or more materials include one or more of an absorber material, a dielectric material, or a metallic material. In another example, the one or more materials include one or more of a non-reflective material, a material having angular dependent reflectivity, or a highly reflective material. Moreover, the one or more materials disposed on the tapered sidewalls are collectively configured to redirect at least a portion of light emitted by the respective LED structure towards the optical element. As mentioned above, when more than one material are disposed on or cover a portion of the tapered sidewalls, the different materials may be disposed in different portions of the tapered sidewalls to produce the desired redirection effect.

In this second implementation of the light emitting device, the multiple LED structures can include a first LED structure made of a material that includes InGaN with a first concentration of In and configured to produce a first color of light, a second LED structure made of a material that includes InGaN with a second concentration of In and configured to produce a second color of light, and a third LED structure made of a material that includes InGaN with a third concentration of In and configured to produce a third color of light.

In this second implementation of the light emitting device, the light emitting device is one of multiple light emitting devices in an array, and the array includes light emitting devices configured to produce the one or more colors of light. Moreover, the array is implemented as part of a display having one or more of the following capabilities: ultra-high-resolution capabilities, high dynamic range capabilities, lightfield capabilities, or high directionality (e.g., as illustrated in FIGS. 2D-2F).

In this second implementation of the light emitting device, at least a portion of one of the LED structures is separated from another one of the LED structures by a trench within which there is included an optically non-transmissive material (e.g., as illustrated in FIGS. 4D and 4E).

Accordingly, although the present disclosure has been provided in accordance with the implementations shown, one of ordinary skill in the art will readily recognize that there could be variations to the embodiments and those variations would be within the scope of the present disclosure. Therefore, many modifications may be made by one of ordinary skill in the art without departing from the scope of the appended claims.

What is claimed is:

1. A light emitting device, comprising:
   a light-emitting diode (LED) structure having an active region and made of a material including GaN, the active region having a p-side and an n-side;
   an optical element disposed on the LED structure and made at least in part of a material including GaN, the optical element configured to collimate and steer a light emitted by the LED structure;
   a sidewall material having a top surface, the optical element having a portion of a tapered sidewall above the top surface of the sidewall material; and
   a reflective contact disposed opposite to the optical element and having a reflective sidewall and a reflective bottom, the sidewall material being disposed between the reflective sidewall and the optical element, the sidewall material terminating at a top surface of the reflective bottom.

2. The light emitting device of claim 1, wherein the optical element is disposed closest to the n-side of the active region.

3. The light emitting device of claim 1, wherein the reflective contact is disposed closest to the p-side of the active region.

4. The light emitting device of claim 1, wherein the optical element is a convex lens.

5. The light emitting device of claim 1, wherein a shape of the optical element is one of a hemispherical shape or an aspherical shape.

6. The light emitting device of claim 5, wherein the aspherical shape is one of a hyperbolic shape, an ellipsoidal shape, or a parabolic shape.

7. The light emitting device of claim 1, wherein a size of the active region is smaller than a size of the optical element.

8. The light emitting device of claim 1, wherein a size of the active region is substantially the same as a size of the optical element.

9. The light emitting device of claim 1, wherein a shape of the optical element is an asymmetric shape to steer the light emitted by the LED structure in a particular direction.

10. The light emitting device of claim 9, wherein the asymmetric shape of the optical element and the particular direction are based on a position of the light emitting device in an array of light emitting devices.

11. The light emitting device of claim 10, wherein the particular direction that the asymmetric shape of the optical element steers the light emitted by the LED structure is towards a center of the array of light emitting devices.

12. The light emitting device of claim 1, wherein the optical element has a submicron size.

13. The light emitting device of claim 1, wherein a size of the optical element ranges from 100 nm to 50 microns and this range includes one or more:
   100 nm to 2 microns,
   1 micron to 5 microns,
   100 nm to 5 microns,
   500 nm to 5 microns, or
   200 nm to 5 microns.

14. The light emitting device of claim 1, wherein a distance from the optical element to the active region includes one or more of:
   100 nm and 2 microns,
   0.5 microns and 3 microns,
   1 micron and 10 microns,
   1 micron and 20 microns,
   1 micron and 25 microns,
   1 micron and 50 microns, or
   10 microns and 100 microns.

15. The light emitting device of claim 1, wherein the reflective contact is an electrically conductive contact disposed on a flat surface opposite the optical element and is configured to direct at least a portion of the light emitted by the LED structure towards the optical element.

16. The light emitting device of claim 1, wherein the active region of the LED structure and the optical element are part of a single crystalline material that includes GaN.

17. The light emitting device of claim 1, wherein the active region of the LED structure and the optical element are part of an epitaxially-grown material that includes GaN and has a continuous refractive index.

18. The light emitting device of claim 1, wherein the active region of the LED structure and the optical element are monolithically integrated.

19. The light emitting device of claim 1, wherein a position of the active region in the LED structure corresponds to a focal point of the optical element.

20. The light emitting device of claim 1, wherein the active region is laterally offset from the optical element.

21. The light emitting device of claim 20, wherein the offset is based on a position of the light emitting device in an array of light emitting devices.

22. The light emitting device of claim 21, wherein the offset is greater when the light emitting device is farther from a center of the array of light emitting devices.

23. The light emitting device of claim 1, wherein the portion of the tapered sidewall is a first portion, at least a portion of the LED structure is tapered such that the tapered sidewall has a second portion formed around the active region of the LED structure.

24. The light emitting device of claim 23, wherein the sidewall material is disposed to cover at least a portion of the tapered sidewalls.

25. The light emitting device of claim 24, wherein the sidewall material includes one or more of:
an absorber material,
a dielectric material, or
a metallic material.

26. The light emitting device of claim 24, wherein the sidewall material includes one or more of:
a non-reflective material,
a material having angular dependent reflectivity, or
a highly reflective material.

27. The light emitting device of claim 24, wherein the sidewall material and the reflective contact are collectively configured to redirect at least a portion of light emitted by the LED structure towards the optical element.

28. The light emitting device of claim 1, wherein the material from which the LED structure is made includes InGaN.

29. The light emitting device of claim 1, wherein:
the light emitting device is one of multiple light emitting devices in an array, and
the array includes light emitting devices configured to produce one or more colors of light.

30. The light emitting device of claim 29, wherein the array is implemented as part of a display having one or more of:
ultra-high-resolution capabilities,
high dynamic range capabilities, or
lightfield capabilities.

31. The light emitting device of claim 1, wherein:
the optical element is a first optical element,
the light emitting device further comprises one or more additional optical elements disposed on the LED structure and made at least in part of a material including GaN, the one or more additional optical elements also being configured to collimate and steer the light emitted by the LED structure.

32. The light emitting device of claim 31, wherein the active region of the LED structure, the first optical element, and the one or more additional optical elements are part of a single crystalline material that includes GaN.

33. The light emitting device of claim 31, wherein the active region of the LED structure, the first optical element, and the one or more additional optical elements are part of an epitaxially-grown material that includes GaN and has a continuous refractive index.

34. The light emitting device of claim 31, wherein the active region of the LED structure, the first optical element, and the one or more additional optical elements are monolithically integrated.

35. The light emitting device of claim 31, wherein the light emitting device is a first light emitting device and is positioned adjacent to a second light emitting device that includes a single LED structure and a second optical element configured to collimate and steer a light emitted by the single LED structure.

36. The light emitting device of claim 35, wherein the first optical element of the first light emitting device is larger than the second optical element of the second light emitting device.

37. The light emitting device of claim 1, wherein at least a portion of the LED structure is separated from another LED structure by a trench within which there is included an optically non-transmissive material.

38. A light emitting device, comprising:
a light-emitting diode (LED) structure having an active region and made of a material including GaN, the active region having a p-side and an n-side;
an optical element disposed on the LED structure and made at least in part of a material including GaN, the optical element configured to collimate and steer a light emitted by the LED structure;
a sidewall material defining an interface with the optical element, the interface having a maximum diameter less than an outer diameter of the optical element; and
a reflective contact disposed opposite to the optical element and having a reflective sidewall and a reflective bottom, the sidewall material being disposed between the reflective sidewall and the optical element, the sidewall material being excluded from a bottom surface of the p-side of the active region.

39. The light emitting device of claim 38, wherein the LED structure is included as one of multiple LED structures, the multiple LED structures include LED structures configured to produce one or more colors of light.

40. The light emitting device of claim 38, wherein the LED structure is included as one of multiple LED structures, the multiple LED structures include a first LED structure configured to produce a first color of light, a second LED structure configured to produce a second color of light, and a third LED structure configured to produce a third color of light.

41. The light emitting device of claim 40, wherein:
the first color of light is green,
the second color of light is red, and
the third color of light is blue.

42. The light emitting device of claim 38, wherein:
the LED structure is included as one of multiple LED structures,
the active region in each of the multiple LED structures includes a p-side and an n-side, and
the optical element is disposed closest to the n-side of the active regions.

43. The light emitting device of claim 38, wherein:
the LED structure is included as one of multiple LED structures,
the active region in each of the multiple LED structures includes a p-side and an n-side, and
the reflective contact is disposed closest to the p-side of the active regions.

44. The light emitting device of claim 38, wherein the optical element is a convex lens.

45. The light emitting device of claim 38, wherein a shape of the optical element is one of a hemispherical shape or an aspherical shape.

46. The light emitting device of claim 45, wherein the aspherical shape is one of a hyperbolic shape, an ellipsoidal shape, or a parabolic shape.

47. The light emitting device of claim 38, wherein the LED structure is included as one of multiple LED structures, and a shape of the optical element is an asymmetric shape to steer the light emitted by the multiple LED structures in a particular direction.

48. The light emitting device of claim 47, wherein the asymmetric shape of the optical element and the particular direction are based on a position of the light emitting device in an array of light emitting devices.

49. The light emitting device of claim 48, wherein the particular direction that the asymmetric shape of the optical element steers the light emitted by the LED structure is towards a center of the array of light emitting devices.

50. The light emitting device of claim 38, wherein a size of the optical element ranges from 100 nm to 50 microns and this range includes at least one or more of:
100 nm to 2 microns,
1 micron to 5 microns,
100 nm to 5 microns,
500 nm to 5 microns, or
200 nm to 5 microns.

51. The light emitting device of claim 38, wherein a distance from the optical element to the active region includes one or more of:
100 nm and 2 microns,
0.5 microns and 3 microns,
1 micron and 10 microns,
1 micron and 20 microns,
1 micron and 25 microns,
1 micron and 50 microns, or
10 microns and 100 microns.

52. The light emitting device of claim 38, wherein the reflective contact is an electrically conductive contact disposed on a flat surface opposite the optical element and is configured to direct at least a portion of the light emitted by the respective LED structure towards the optical element.

53. The light emitting device of claim 38, wherein the active region of the respective LED structure and the optical element are part of a single crystalline material that includes GaN.

54. The light emitting device of claim 38, wherein the active region of the respective LED structure and the optical element are part of an epitaxially-grown material that includes GaN and has a continuous refractive index.

55. The light emitting device of claim 38, wherein the active region of the respective LED structure and the optical element are monolithically integrated.

56. The light emitting device of claim 38, wherein the LED structure is included as one of multiple LED structures, at least a portion of each of the multiple LED structures is tapered such that tapered sidewalls are formed around the active region of the respective LED structure.

57. The light emitting device of claim 56, wherein the sidewall material is disposed to cover at least a portion of the tapered sidewalls.

58. The light emitting device of claim 57, wherein the sidewall material includes one or more of:
an absorber material,
a dielectric material, or
a metallic material.

59. The light emitting device of claim 57, wherein the sidewall material includes one or more of:
a non-reflective material,
a material having angular dependent reflectivity, or
a highly reflective material.

60. The light emitting device of claim 57, wherein the sidewall material and the reflective contact are collectively configured to redirect at least a portion of light emitted by the respective LED structure towards the optical element.

61. The light emitting device of claim 38, wherein the LED structure is included as one of multiple LED structures, the multiple LED structures include:
a first LED structure made of a material that includes InGaN with a first concentration of In and configured to produce a first color of light,
a second LED structure made of a material that includes InGaN with a second concentration of In and configured to produce a second color of light, and
a third LED structure made of a material that includes InGaN with a third concentration of In and configured to produce a third color of light.

62. The light emitting device of claim 38, wherein:
the light emitting device is one of multiple light emitting devices in an array, and
the array includes light emitting devices configured to produce one or more colors of light.

63. The light emitting device of claim 62, wherein the array is implemented as part of a display having one or more of:
ultra-high-resolution capabilities,
high dynamic range capabilities, or
lightfield capabilities.

64. The light emitting device of claim 38, wherein at least a portion of the LED structure is separated from another LED structure by a trench within which there is included an optically non-transmissive material.

65. The light emitting device of claim 38, wherein a number of the LED structures, including the LED structure, ranges from 10 to 200 LED structures.

* * * * *